(12) United States Patent
Ishida et al.

(10) Patent No.: US 6,617,182 B2
(45) Date of Patent: *Sep. 9, 2003

(54) SEMICONDUCTOR DEVICE AND SEMICONDUCTOR SUBSTRATE, AND METHOD FOR FABRICATING THE SAME

(75) Inventors: Masahiro Ishida, Osaka (JP); Shinji Nakamura, Osaka (JP); Kenji Orita, Osaka (JP); Osamu Imafuji, Osaka (JP); Masaaki Yuri, Osaka (JP)

(73) Assignee: Matsushita Electric Industrial Co., Ltd., Osaka (JP)

(*) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/395,261

(22) Filed: Sep. 14, 1999

(65) Prior Publication Data

US 2002/0137249 A1 Sep. 26, 2002

(30) Foreign Application Priority Data

Sep. 14, 1998 (JP) .......................................... 10-259907
May 14, 1999 (JP) .......................................... 11-133844

(51) Int. Cl.$^7$ ............................................ H01L 21/00
(52) U.S. Cl. ............................. 438/22; 438/41; 438/44; 438/46; 438/483
(58) Field of Search ................. 438/22, 46, 47, 438/478, 479, 481, 483, 40, 41, 43, 44, 700, 705, 706, 718

(56) References Cited

U.S. PATENT DOCUMENTS

| | | | |
|---|---|---|---|
| 5,032,893 A | | 7/1991 | Fitzgerald, Jr. et al. |
| 5,208,182 A | | 5/1993 | Narayan et al. |
| 5,285,086 A | | 2/1994 | Fitzgerald, Jr. |
| 5,294,808 A | | 3/1994 | Lo |
| 5,834,325 A | * | 11/1998 | Motika et al. ................ 438/22 |
| 6,015,979 A | * | 1/2000 | Sugiura et al. ............... 257/86 |
| 6,051,849 A | * | 4/2000 | Davis et al. .................. 257/76 |
| 6,111,277 A | * | 8/2000 | Ikeda .......................... 257/99 |
| 6,121,634 A | * | 9/2000 | Saito et al. ................... 257/86 |
| 6,153,010 A | * | 11/2000 | Kiyoku et al. ................ 117/95 |
| 6,177,688 B1 | * | 1/2001 | Linthicum et al. ............ 257/77 |
| 6,337,223 B1 | | 1/2002 | Kim et al. |

FOREIGN PATENT DOCUMENTS

| | | |
|---|---|---|
| EP | 0 505 093 A2 | 9/1992 |
| EP | 0 609 799 A2 | 8/1994 |
| JP | 57-115849 | 7/1982 |
| JP | 03-133182 | 6/1991 |
| JP | 4-34920 | 2/1992 |
| JP | 404297023 | * 10/1992 |

(List continued on next page.)

OTHER PUBLICATIONS

Kapolenek et al "ansiotropic epitaxail growth in GaN selective area epitaxy", Appl. Phys. Letts, vol. 71,9/1/9197, pp 1204–1206.*

Nam et al lateral epitaxy of low defect density GaN layers via organomatallic vapor phase epitaxy, Appl. Phys. Letts vol. 71, 1997 pp 2638–2640.*

"Thick GaN Expitaxial Growth with Low Dislocation Density by Hudride Vapor Phase Epitaxy", by Akira Usui, et al., Jpn. J. Appl. Phys. vol. 36, (1997), Part 2, No. 7B, Jul. 15, 1997, pp. 899–902.

*Primary Examiner*—Savitri Mulpuri
(74) *Attorney, Agent, or Firm*—Snell & Wilmer, LLP

(57) ABSTRACT

A semiconductor device includes: a crystalline substrate including a primary surface and a crystal plane provided within the primary surface so as to have a surface orientation different from a surface orientation of the primary surface; a semiconductor layered structure grown over the crystalline substrate; and an active region provided at a portion in the semiconductor layer structure above the crystal plane.

16 Claims, 15 Drawing Sheets

FOREIGN PATENT DOCUMENTS

| | | |
|---|---|---|
| JP | 4-318918 | 11/1992 |
| JP | 05-036602 | 2/1993 |
| JP | 6-216037 | 5/1994 |
| JP | 6-216037 | 8/1994 |
| JP | 06268257 A | 9/1994 |
| JP | 409018092 * | 1/1997 |
| JP | 09-172200 | 6/1997 |
| JP | 10312971 A | 11/1998 |
| JP | 11-312825 | 11/1999 |
| JP | 11-340508 | 12/1999 |
| JP | P2000-21789 A | 1/2000 |

* cited by examiner

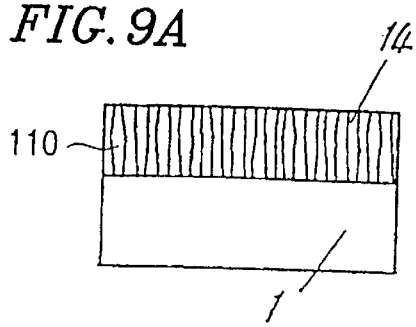
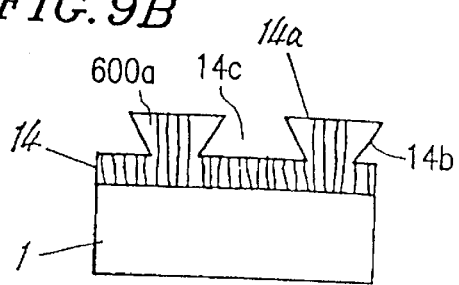
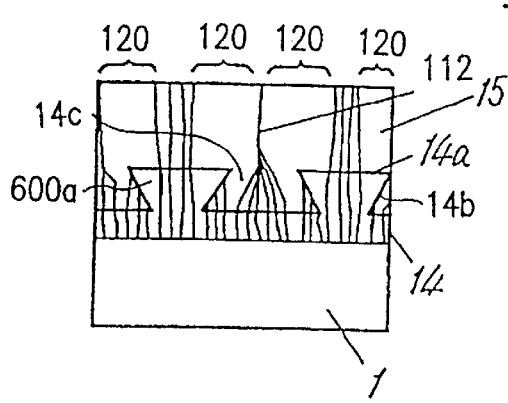
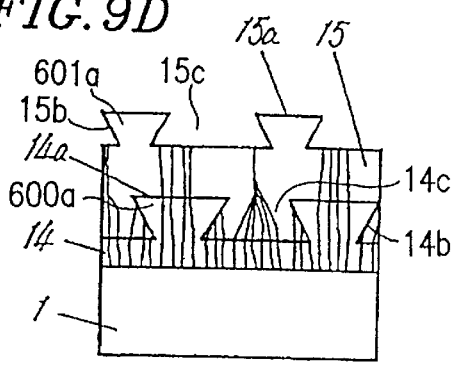
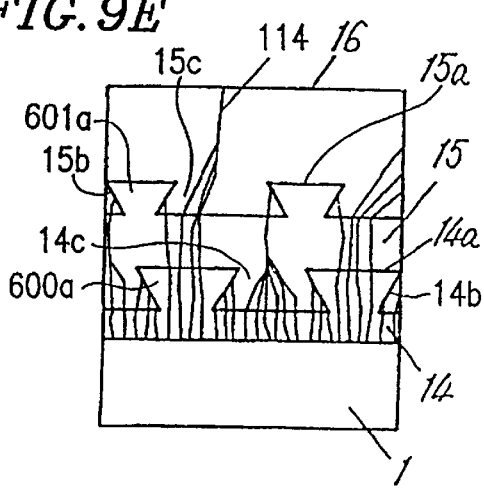
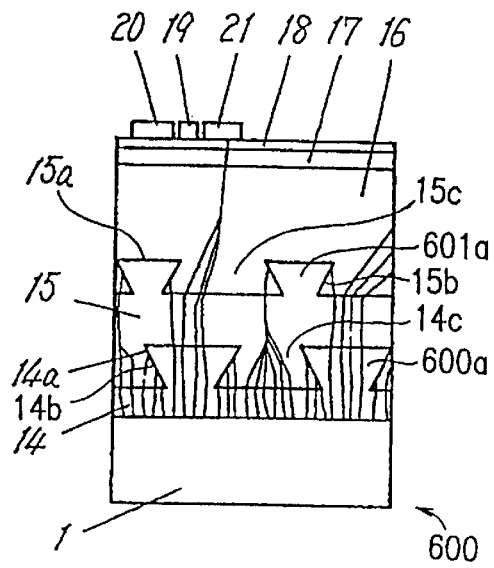

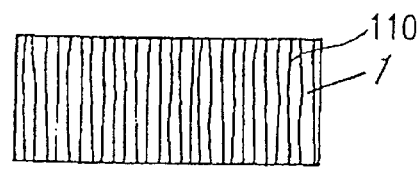
*FIG. 15A*
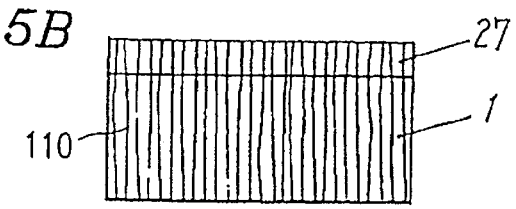
*FIG. 15B*
*FIG. 15C(a)*  *FIG. 15C(b)*
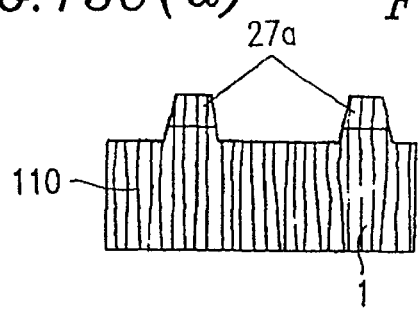  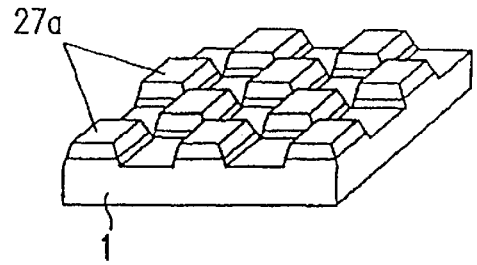
*FIG. 15D*  *FIG. 15E*
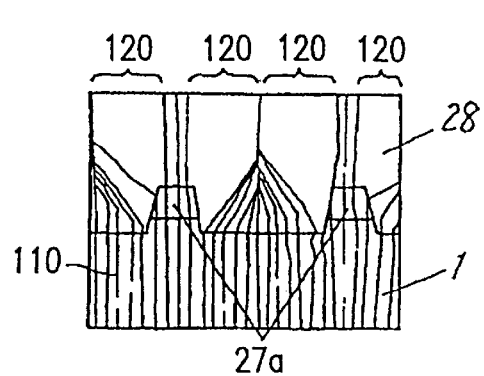  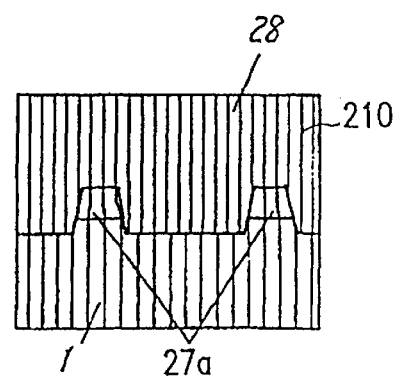

SEMICONDUCTOR DEVICE AND SEMICONDUCTOR SUBSTRATE, AND METHOD FOR FABRICATING THE SAME

BACKGROUND OF THE INVENTION

1. Field of the Invention

The present invention relates to a semiconductor device, more particularly to a nitride semiconductor device such as a blue laser and a fast-operation transistor, and to a method for fabricating the same. The present invention also relates to a semiconductor substrate and a fabrication method thereof to be used for the above-mentioned semiconductor device and a fabrication method thereof.

2. Description of the Related Art

FIG. 4 is a cross sectional view illustrating a conventional semiconductor device 1000. In FIG. 4, a buffer layer 50 is provided on a substrate 1 made of sapphire. On the buffer layer 50, successively provided are an n-type GaN layer 2, an n-type AlGaN cladding layer 3, an n-type GaN light guiding layer 4, an active layer 5 made of i-type InGaN, a p-type GaN light guiding layer 6, a first p-type AlGaN cladding layer 7, a current constriction layer 8 having an opening 8a, a second p-type AlGaN cladding layer 9, and a p-type GaN contact layer 10. Furthermore, an n-type electrode 11 is provided on the lower surface of the substrate 1 while a p-type electrode 12 is provided on the upper surface of the p-type GaN contact layer 10.

The buffer layer 50 is provided for relieving lattice mismatch between the substrate 1 and the n-type GaN layer 2, thereby facilitating crystal growth of the n-type GaN layer 2. The buffer layer 50 has substantially no direct influence on operation of the semiconductor device 1000.

Since the active layer 5 is formed of a nitride semiconductor material, the semiconductor device 1000 can serve as a laser emitting blue light (i.e., as a blue laser) when a voltage is applied between the n-type electrode 11 and the p-type electrode 12.

As shown in FIG. 4, however, linear lattice defects 1010 existing in the substrate 1 extend upward as the n-type GaN layer 2, the n-type AlGaN cladding layer 3, and the like, are grown. Such linear lattice defects 1010 finally reach a portion of the i-type GaN active layer 5 under the opening 8a of the current constriction layer 8, the portion serving as an active region of the semiconductor device 1000 as a semiconductor laser.

When the semiconductor device 1000 requires a high current injection for its operation, for example, as a semiconductor laser, such a high current injection is likely to deteriorate the semiconductor device 1000 from a portion thereof having the lattice defect 1010, and thus significantly reduce the life time and reliability thereof.

In addition, when the semiconductor device 1000 is supposed to serve as a fast-operation semiconductor transistor element, a gate region of the fast-operation semiconductor transistor element also is adversely affected by the lattice defect so that a carrier mobility is decreased, thereby deteriorating the performance of the semiconductor transistor element.

As described above, the existence of the lattice defect in the active layer of the semiconductor laser element, the gate region of the semiconductor transistor element, and the like which function as an active region in the semiconductor device 1000 leads to a deterioration in the performance thereof.

SUMMARY OF THE INVENTION

The semiconductor device of this invention includes: a crystalline substrate including a primary surface and a crystal plane provided within the primary surface so as to have a surface orientation different from a surface orientation of the primary surface; a semiconductor layered structure grown over the crystalline substrate; and an active region provided at a portion in the semiconductor layer structure above the crystal plane.

Preferably, the portion in the semiconductor layer structure at which the active region is provided contains fewer defects as compared to surrounding regions.

In one embodiment, the crystal plane is a tilted surface which is tilted with respect to the primary surface of the crystalline substrate, and the active region is positioned above lattice defects which extend in a direction substantially perpendicular to the crystal plane.

In one embodiment, a convex-and-concave structure is provided in the primary surface of the crystalline substrate, and the crystal plane is part of the convex-and-concave structure.

A convex portion included in the convex-and-concave structure may have a forward mesa structure.

A convex portion included in the convex-and-concave structure may have a cross section in the shape of a triangle pointing upward from the primary surface of the crystalline substrate.

The convex-and-concave structure may have a periodic structure.

According to another aspect of the invention, a semiconductor device includes: a crystalline substrate; a first semiconductor layer provided on the crystalline substrate; a second semiconductor layer provided on the first semiconductor layer; and an active region provided in the second semiconductor layer, wherein each of the crystalline substrate and the first semiconductor layer includes a primary surface and a crystal plane provided at least within the primary surface so as to have a surface orientation different from a surface orientation of the primary surface.

In one embodiment, the crystal plane of the first semiconductor layer is a tilted surface which is tilted with respect to the primary surface of the first semiconductor layer, and the active region is positioned above lattice defects extending in a direction substantially perpendicular to the crystal plane of the first semiconductor layer.

In one embodiment, a convex-and-concave structure is provided over the crystalline substrate, and the crystal plane of the crystalline substrate or that of the first semiconductor layer is part of the convex-and-concave structure.

In one embodiment, the crystal plane of the first semiconductor layer is positioned above the crystal plane of the crystalline substrate.

A convex portion included in the convex-and-concave structure may have a forward mesa structure.

A convex portion included in the convex-and-concave structure may have a cross section in the shape of a triangle pointing upward from the crystalline substrate.

The convex-and-concave structure may have a periodic structure.

In the aforementioned semiconductor devices, the active region may be made of a III group nitride compound material, and serve as a light emitting region of a light emitting element.

The active region may be made of a III group nitride compound material, and serve as a gate of a field effect transistor.

The active region may be made of a III group nitride compound material, and serve as a base of a bipolar transistor.

The active region may be made of a III group nitride compound material, and serve as a junction region of a diode.

A method for fabricating a semiconductor device according to the present invention includes the steps of: forming a crystal plane on a primary surface of a substrate so that a surface orientation of the crystal plane is different from a surface orientation of the primary surface of the substrate; and forming a semiconductor layered structure made of a III group nitride compound material over the crystal plane and the primary surface of the substrate.

In one embodiment, the crystal plane forming step includes the steps of: forming a mask having a predetermined pattern on the substrate; and selectively etching a portion of the substrate not covered with the mask.

In one embodiment, the substrate is made of $Al_xGa_{1-x}N$ ($0 \leq x \leq 1$), and the semiconductor layered structure forming step includes the step of forming an $Al_yGa_{1-y}N$ layer ($0 \leq y \leq 1$) at a crystal growth temperature of about 900° C. or more.

In one embodiment, the substrate is made of sapphire, silicon carbide, silicon, or gallium arsenide, and the semiconductor layered structure forming step includes the steps of: forming over the substrate, a first $Al_aGa_{1-a}N$ layer ($0 \leq a \leq 1$) at a crystal growth temperature in a range of about 400° C. to about 900° C.; and forming over the first $Al_aGa_{1-a}N$ layer, a second $Al_bGa_{1-b}N$ layer ($0 \leq b \leq 1$) at a crystal growth temperature of about 900° C. or more.

In one embodiment, the semiconductor layered structure forming step includes the step of introducing an impurity to a predetermined portion of the semiconductor layered structure at a concentration of about $10^{21}$ cm$^{-3}$ or less.

In one embodiment, in the semiconductor layered structure forming step, a mole supply ratio of a V group source material to a III group source material (a V/III ratio) is about 200 or more.

According to another aspect of the present invention, a method for fabricating a semiconductor device includes the steps of: forming a first crystal plane on a primary surface of a substrate so that a surface orientation of the first crystal plane is different from a surface orientation of the primary surface of the substrate; forming a first semiconductor layer over the crystal plane and the primary surface of the substrate; forming a second crystal plane on a primary surface of the first semiconductor layer so that a surface orientation of the second crystal plane is different from a surface orientation of a primary surface of the first semiconductor layer; and forming a second semiconductor layer made of a III group nitride compound material over the second crystal plane and the primary surface of the first semiconductor layer.

In one embodiment, the second semiconductor layer forming step includes the steps of forming a mask having a predetermined pattern on the first semiconductor layer, and selectively etching a portion of the first semiconductor layer not covered with the mask.

In one embodiment, the substrate is made of $Al_xGa_{1-x}N$ ($0 \leq x \leq 1$), and the second semiconductor layer forming step includes the step of forming an $Al_yGa_{1-y}N$ layer ($0 \leq y \leq 1$) at a crystal growth temperature of about 900° C. or more.

In one embodiment, the substrate is made of sapphire, silicon carbide, silicon, or gallium arsenide, and the second semiconductor layer forming step includes the steps of: forming over the substrate, a $Al_aGa_{1-a}N$ buffer layer ($0 \leq a \leq 1$) at a crystal growth temperature in a range of about 400° C. to about 900° C.; and forming over the $Al_aGa_{1-a}N$ buffer layer, a second $Al_bGa_{1-b}N$ layer ($0 \leq b \leq 1$) at a crystal growth temperature of about 900° C. or more.

In one embodiment, the second semiconductor layer forming step includes the step of introducing an impurity to the second semiconductor layer at a concentration of about $10^{21}$ cm$^{-3}$ or less.

In one embodiment, in the second semiconductor layer forming step, a mole supply ratio of a V group source material to a III group source material (a V/III ratio) is about 200 or more.

According to still another aspect of the present invention, a method for fabricating a semiconductor substrate is provided to include the steps of: forming a crystal plane on a primary surface of a substrate so that a surface orientation of the crystal plane is different from a surface orientation of the primary surface of the substrate; forming a semiconductor layer made of a III group nitride compound material over the crystal plane and the primary surface of the substrate; and separating the semiconductor layer from the substrate.

In the aforementioned semiconductor device according to the present invention, the crystal plane provided within the primary surface of the substrate may extend along a <1,1,-2,0> direction.

According to the present invention, a semiconductor layer in a semiconductor layered structure is grown in a certain direction in accordance with the shape of an upper surface of an underlying semiconductor layer including a primary surface and a tilted surface. In addition, a growth direction of a linear lattice defect in the overlying semiconductor layer also deviates from a normal direction of the primary surface of the underlying semiconductor layer. Thus, the overlying semiconductor layer is allowed to have a region where the density of lattice defects therein is reduced. This region containing reduced (i.e., fewer) defects can be used for forming an active region of the resultant semiconductor device, thereby resulting in improved operational characteristics.

Thus, the invention described herein makes possible the advantages of (1) providing a semiconductor device with a high degree of reliability and performance by reducing lattice defects in an active region of the semiconductor device; (2) providing a method for fabricating such a semiconductor device; and (3) providing a semiconductor substrate and a fabrication method thereof to be used for the above-mentioned semiconductor device and a fabrication method thereof.

These and other advantages of the present invention will become apparent to those skilled in the art upon reading and understanding the following detailed description with reference to the accompanying figures.

BRIEF DESCRIPTION OF THE DRAWINGS

FIGS. 9A through 9F are cross-sectional views illustrating a method of fabricating a semiconductor device according to Example 6 of the present invention.

FIGS. 15A, 15B, 15C(a), 15D, and 15E are cross-sectional views, and FIG. 15C(b) is a perspective view, illustrating a method of fabricating the semiconductor substrate shown in FIG. 14.

DESCRIPTION OF THE PREFERRED EMBODIMENTS

The embodiments of the present invention will be described below with reference to the accompanying drawings.

EXAMPLE 1

Figure 1:
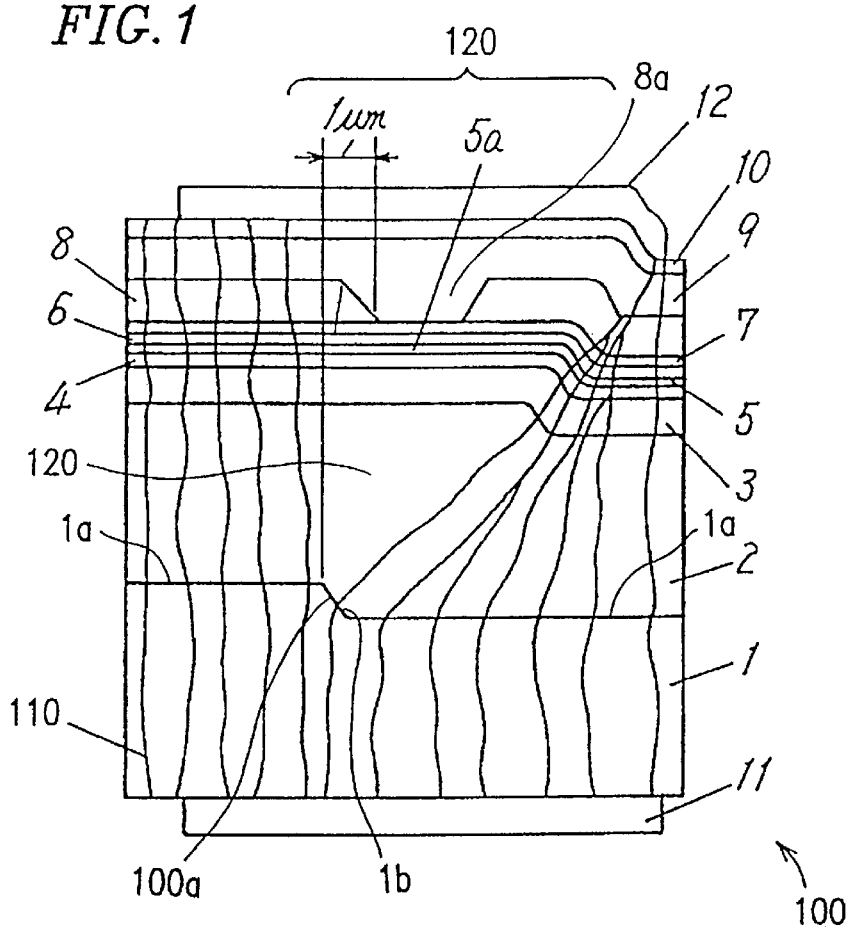
FIG. 1 is a cross-sectional view of a semiconductor device according to Example 1 of the present invention.

FIG. 1 is a cross-sectional view illustrating a semiconductor device 100 as a semiconductor laser element according to Example 1 of the present invention.

Referring to FIG. 1, a substrate 1 is a hexagonal n-type GaN (0,0,0,1) substrate. There are linear lattice defects 110 in the substrate 1. A stepped portion 100a is provided in an upper surface of the substrate 1 so as to form a concave-and-convex configuration. A stepped portion 100a includes a tilted surface 1b (tilted crystal plane). Thus, the upper surface of the substrate 1 includes a primary surface 1a and a tilted surface 1b.

An n-type GaN layer 2 with a thickness of 5 $\mu$m is provided on the substrate 1. On the n-type GaN layer 2, successively provided are an n-type AlGaN cladding layer 3 with a thickness of 0.5 $\mu$m (a mixed crystal ratio of Al to Ga is 10:90), an n-type GaN light guiding layer 4 with a thickness of 0.1 $\mu$m, an active layer 5 including an InGaN quantum well composed of InGaN layer(s) each with a thickness of 5 nm (not shown, a mixed crystal ratio of In to Ga is 5:95) and InGaN layer(s) each with a thickness of 5 nm (not shown, a mixed crystal ratio of In to Ga is 15:85), a p-type GaN light guiding layer 6 with a thickness of 0.05 $\mu$m, a first p-type AlGaN cladding layer 7 with a thickness of 0.05 $\mu$m (a mixed crystal ratio of Al to Ga is 10:90), and a current constriction layer 8 with a thickness of 0.5 $\mu$m having an opening 8a with a width of 2 $\mu$m. A portion of the active layer 5 in the vicinity of the opening 8a of the current constriction layer 8 includes an active region 5a of the resultant semiconductor laser.

The current constriction layer 8 may have a conductivity type opposite to that of the first p-type AlGaN cladding layer 7, or have high resistance. A constituent material of the current constriction layer 8 may be a semiconductor material such as GaN and AlGaN, or an insulating material such as AlN and $SiO_2$. The active layer 5 is composed of the InGaN quantum well, which may be a single quantum well or a multiple quantum well including two or more well layers. Alternatively, a bulk active layer may be used as the active layer 5.

On the current constriction layer 8, a second p-type AlGaN cladding layer 9 (a mixed crystal ratio of Al to Ga is 10:90) with a thickness of 1 $\mu$m and a p-type GaN contact layer 10 with a thickness of 0.1 $\mu$m are successively formed.

Furthermore, an n-type electrode 11 is attached to the lower surface of the substrate 1 while a p-type electrode 12 is attached to the upper surface of the p-type GaN contact layer 10. When a voltage is applied between the n-type electrode 11 and the p-type electrode 12, the active layer 5 emits light.

In the semiconductor device 100 of the present example, the substrate 1 has the stepped portion 100a with the tilted surface 1b which is tilted with respect to an axis perpendicular to the primary surface 1a of the substrate 1 (i.e., the normal direction thereof). Thus, a crystal growth direction of the n-type GaN layer 2 is oriented toward a tilted direction in accordance with the tilt of the stepped portion 100a. Therefore, the linear lattice defects 110 also extend toward the above tilted direction, which leads to formation of a low-defect region 120 in the n-type GaN layer 2 which contains relatively fewer (i.e., reduced) amount of lattice defects as compared to the remaining regions in the n-type GaN layer 2. Furthermore, the low-defect region 120 is also formed in the n-type AlGaN cladding layer 3, the n-type GaN light guiding layer 4, and the active layer 5 which are epitaxially grown on the n-type GaN layer 2. The active region 5a is positioned in the low-defect region 120. Thus, the fewer amount of lattice defects 110 in the active region 5a improves the reliability of the semiconductor device 100.

It is preferable to provide the active region 5a in a flat portion of the active layer 5.

When alternate convex and concave configurations providing a plurality of stepped portions with tilted surfaces are periodically provided in the upper surface of the substrate 1, it becomes possible to produce a plurality of the low-defect regions 120 periodically. By providing these periodic convex and concave configurations, a plurality of semiconductor laser elements can be periodically formed on the substrate 1, resulting in an efficient fabrication thereof.

When the stepped portion 100a is formed in the upper surface of the substrate 1 in such a way that an angle between the normal line of a primary surface 1a of the substrate 1 and the normal line of the tilted surface 1b of the stepped portion 100a is 90° or less, it is easy to epitaxially grow the n-type GaN layer 2. Hereinafter, a method for fabricating the stepped portion 100a in such a manner will be described.

Figure 2A:
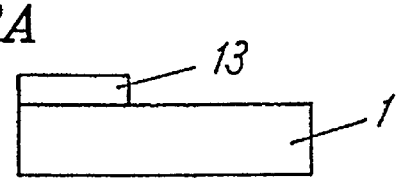
FIGS. 2A, 2B(a), and 2B(b) are partial cross-sectional views of the semiconductor device shown in FIG. 1 for explaining a fabrication method thereof.
Figure 2B:
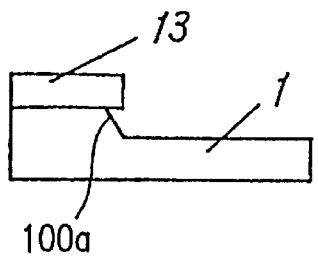
Figure 2B:
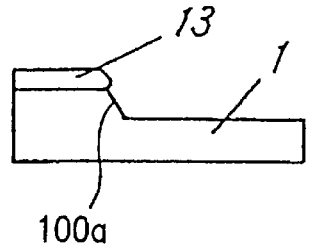

FIGS. 2A, 2B(a), and 2B(b) illustrate steps of processing the upper surface of the substrate 1.

As shown in FIG. 2A, the upper surface of the substrate 1 is covered with a mask 13. Then, as shown in FIG. 2B(a), the upper surface of the substrate 1 is etched by side etching. As a result, a portion of the upper surface of the substrate 10 under the mask 13 is removed, resulting in the stepped portion 100a. Alternatively, after being covered with the mask 13, the upper surface of the substrate 1 is etched by selecting a condition such that the mask 13 is also etched, resulting in the stepped portion 100a, as shown in FIG. 2B(b).

Examples of surface orientations of the substrate 1 include a (1,1,1) plane, (−1,1,1) plane, (1,−1,1) plane, (−1,−1,1) plane, (1,1,−1) plane, (−1,1,−1) plane, (1,−1,−1) plane, and (−1,−1,−1) plane of cubic crystal, or a (0,0,0,1) plane and (0,0,0,−1) plane of hexagonal crystal, or the like.

To produce the semiconductor device 100 according to Example 1, examples of a crystal growth method include metal organic chemical vapor deposition (hereinafter referred to as MOCVD), molecular beam epitaxy (hereinafter referred to as MBE), hydride vapor phase epitaxy (hereinafter referred to as HVPE), and a combination thereof.

A life test was conducted for the semiconductor device 100 according to Example 1 and a conventional semiconductor device. A result of the life test will be described.

In this life test, a number of semiconductor laser elements were operated to output a constant degree of light at a temperature of 100° C.

About a half number of the conventional semiconductor laser elements ceased to operate within 1000 hours after the start of the life test. The remaining half number of the conventional laser elements exhibited significantly deteriorated characteristics such as a 50% increase in an operational current on average. In contrast, all of the semiconductor laser elements according to the present invention still operated after 1000 hours passed since the start of the life test, having only a 2% increase in an operational current on average, thereby confirming that a significant improvement in characteristics was obtained.

EXAMPLE 2

A semiconductor device according to Example 2 of the present invention will be described, along with a fabrication method thereof, with reference to FIGS. 3A through 3F.

Figure 3A:
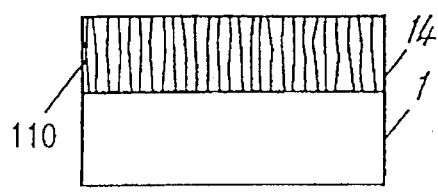
FIGS. 3A through 3F are cross-sectional views illustrating a method of fabricating a semiconductor device according to Example 2 of the present invention.

As illustrated in FIG. 3A, an AlN layer 14 with a thickness of 5 μm is formed on a (0,0,0,1) sapphire substrate 1 by MOCVD at a temperature of 1000° C. In the AlN layer 14, lattice defects 110 are generated due to a difference in a lattice constant between AlN and sapphire.

Figure 3B:
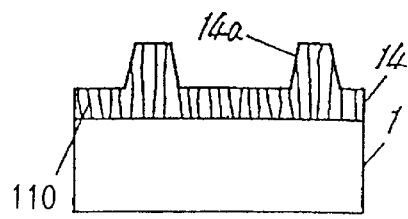

As shown in FIG. 3B, a concave and convex structure 14a providing tilted surfaces is then provided for serving as a first stepped configuration on an upper surface of the AlN layer 14 by reactive ion etching. The concave and convex structure 14a has a periodic interval of 10 μm, a width of 2 μm at a top surface of a convex portion (ridge) thereof which has a forward mesa structure, and a depth of 3 μm at a concave portion thereof. A tilted surface of the concave portion of the concave and convex structure 14a extends along a <1,1,−2,0> direction.

Figure 3C:
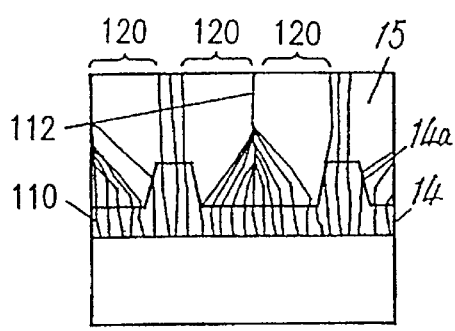

As shown in FIG. 3C, a GaN layer 15 with a thickness of 10 μm is formed on the AlN layer 14 by MOCVD. As the GaN layer 15 is deposited, substantially all of linear lattice defects 110 of the GaN layer 15 on the concave portion of the AlN layer 14 extend toward and reach a middle portion over the concave portion of the AlN layer 14, and finally merge with each other into a single linear lattice defect 112. In the thus formed GaN layer 15, the linear lattice defects substantially only exist in the vicinity of the middle portion over the concave portion of the AlN layer 14 (linear lattice defect 112) and in the vicinity of a top surface of the convex portion of the AlN layer 14 (linear lattice defect 110). The remaining regions of the GaN layer 15 become low-defect regions 120.

Figure 3D:
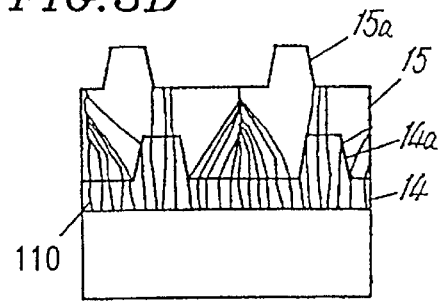

To further reduce the amount of the remaining lattice defects 110 and 112, as shown in FIG. 3D, other convex portions each having a forward mesa structure are formed in the GaN layer 15, respectively, over every two of the low-defect regions 120 to produce another concave and convex structure 15a serving as a second stepped configuration. A periodic interval, width of a top surface of a convex portion, and depth of the concave and convex structure 15a are the same as those of the concave and convex structure 14a.

Figure 3E:
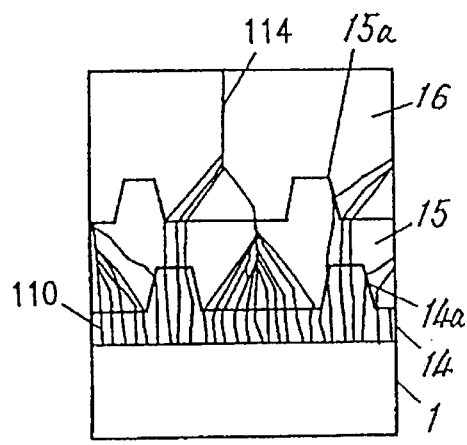

Thereafter, as shown in FIG. 3E, a GaN layer 16 with a thickness of 20 μm is formed on the GaN layer 15 by HVPE. As the GaN layer 16 is deposited, substantially all of linear lattice defects of the GaN layer 16 originated from the linear lattice defects 110 and 112 extend toward and reach a middle portion over the concave portion of the concave and convex structure 15a, and finally merge with each other into a single linear lattice defect 114, thereby further reducing the amount of the linear lattice defects.

Figure 3F:
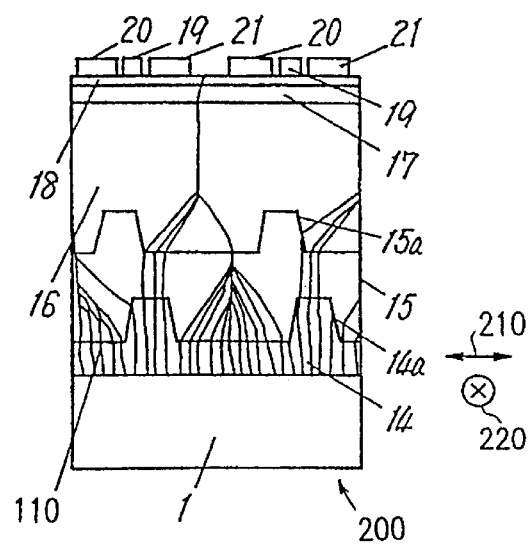
Figure 4:
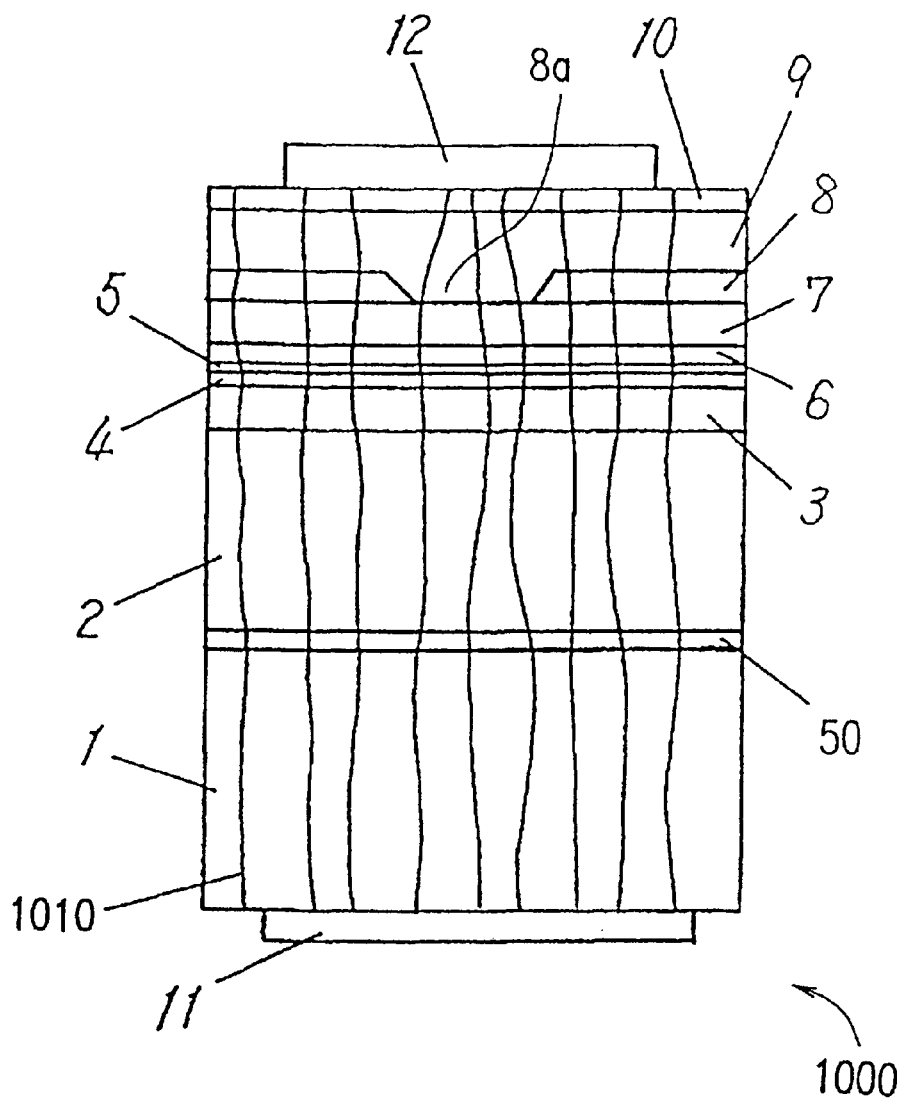
FIG. 4 is a cross-sectional view of a conventional semiconductor device.

As shown in FIG. 3F, an undoped GaN layer 17 with a thickness of 2 μm and an n-type GaN layer 18 with a thickness of 100 Å are successively formed on the GaN layer 16 by MOCVD. On the n-type GaN layer 18, a gate electrode 19, a source electrode 20, and a drain electrode 21 are provided to obtain a complete semiconductor transistor element 200.

A material for the gate electrode 19 is preferably a conductor material having a work function of 4.5 eV or more, preferably 5 eV or more, such as Au, Ni, Pt, Pd, and an alloy or compound thereof. A material for the source electrode 20 and the drain electrode 21 is preferably a conductor material having a work function of 5 eV or less, preferably 4.5 eV or less, such as Al, Ti, In, TiN, and an alloy or compound thereof.

The gate electrode 19 which serves as a gate region of the semiconductor transistor element 200 of the present invention is formed in the vicinity of the low-defect region 120 in the n-type GaN layer 18. Therefore, fast operation characteristics of the semiconductor transistor element 200 are improved.

By comparing a cut-off frequency of the semiconductor transistor element 200 according to Example 2 of the present invention with that of a conventional semiconductor transistor element having substantially no low-defect region, the semiconductor transistor device 200 can work at a frequency four times higher than that of the conventional transistor element. It may be understood that electron mobility is enhanced because of a reduction of the amount of lattice defects in the gate region serving as an active region of the semiconductor transistor element 200 in accordance with the present invention, thereby resulting in an increased operational frequency.

An operation test was conducted for the semiconductor transistor element 200 and the conventional semiconductor transistor element at a temperature of 700° C. As a result, the conventional semiconductor transistor element ceased to operate within 1000 hours after the start of the operation test. On the other hand, the semiconductor transistor element 200 of Example 2 still maintained high-frequency characteristics thereof after 1000 hours passed since the start of the operation test.

In the above-described semiconductor transistor element 200, the concave portion of the concave and convex structure 14a and the concave portion of the concave and convex structure 15a each extend along the same direction as indicated by reference numeral 220 in FIG. 3F. (Direction 220 is referred to as the "direction perpendicular to the drawing paper plane".) Accordingly, the lattice defects 110, 112, and 114 can be merged with each other with respect to a direction indicated by reference numeral 210 in FIG. 3F, which is perpendicular to the direction 220 (Direction 210 is referred to as the "direction within the drawing paper plane".) Alternatively, when the concave portion of the concave and convex structure 14a and the concave portion of the concave and convex structure 15a are provided so as to be orthogonal to each other, the lattice defects 110, 112, and 114 can be further merged with each other with respect to the direction 220 perpendicular to the drawing paper plane.

Examples of a shape of the concave and convex structure 14a and 15a include a grid, a hexagonal honeycomb, a circle, an irregular form, and the like other than a rectangular as described in Example 2.

In order to obtain a larger low-defect region, a periodic interval of the concave and convex structure is set to be preferably as large as possible.

In the above examples, the active layer of the semiconductor laser element or the gate region of the semiconductor transistor element (field effect transistor) is provided in the low-defect region as described above. Alternatively, a light emitting region of a light emitting diode, a base region of a bipolar transistor, or a junction region of a diode may be provided in the low-defect region, resulting in the same effects as those described above.

EXAMPLE 3

Figure 5:
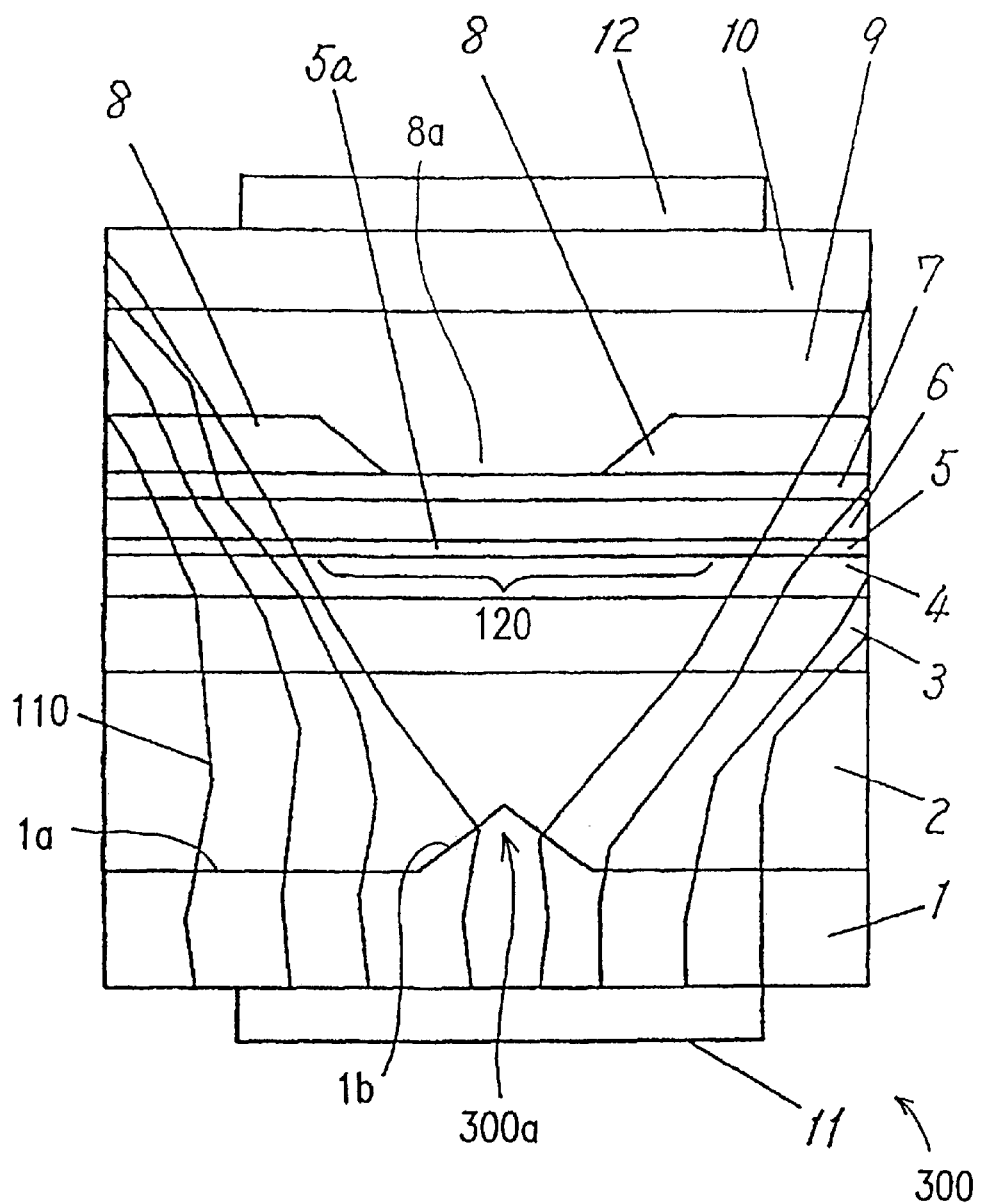
FIG. 5 is a cross-sectional view of a semiconductor device according to Example 3 of the present invention.

FIG. 5 is a cross-sectional view illustrating a semiconductor device 300 according to Example 3 of the present invention.

A substrate 1 is a hexagonal n-type GaN (0,0,0,1) substrate. Linear lattice defects 110 exist in the substrate 1. A convex portion 300a having tilted surfaces with a surface orientation different from (0,0,0,1) is provided in an upper surface of the substrate 1 so as to provide a concave-and-convex configuration. Thus, the upper surface of the substrate 1 includes a primary surface 1a and the tilted surfaces 1b. The convex portion 300a has a cross section in the shape of a triangle pointing upward from the primary surface 1a of the substrate 1.

An n-type GaN layer 2 with a thickness of 5 $\mu$m is formed on the upper surface of the substrate 1. On the n-type GaN layer 2, successively provided are an n-type AlGaN cladding layer 3 with a thickness of 0.5 $\mu$m (a mixed crystal ratio of Al to Ga is 10:90), an n-type GaN light guiding layer 4 with a thickness of 0.1 $\mu$m, an active layer 5 including an InGaN quantum well composed of InGaN layer(s) (not shown) each with a thickness of 5 nm (a mixed crystal ratio of In to Ga is 5:95) and InGaN layer(s) (not shown) each with a thickness of 5 nm (a mixed crystal ratio of In to Ga is 15:85), a p-type GaN light guiding layer 6 with a thickness of 0.05 $\mu$m, a first p-type AlGaN cladding layer 7 with a thickness of 0.05 $\mu$m (a mixed crystal ratio of Al to Ga is 10:90), a current constriction layer 8 with a thickness of 0.5 $\mu$m including an opening 8a with a width of 2 $\mu$m. A portion of the active layer 5 in the vicinity of the opening 8a of the current constriction layer 8 includes an active region 5a of a semiconductor laser.

The current constriction layer 8 may be of a conductivity type opposite to that of the first p-type AlGaN cladding layer 7 or of high resistance. A material of the current constriction layer 8 may be a semiconductor material such as GaN and AlGaN, or an insulator material such as AlN and $SiO_2$.

On the current constriction layer 8, a second p-type AlGaN cladding layer 9 (a mixed crystal ratio of Al to Ga is 10:90) with a thickness of 1 $\mu$m and a p-type GaN contact layer 10 with a thickness of 0.1 $\mu$m are successively formed.

Furthermore, an n-type electrode 11 is attached to the lower surface of the substrate 1 while a p-type electrode 12 is attached to the upper surface of the p-type GaN contact layer 10. When a voltage is applied between the n-type electrode 11 and the p-type electrode 12, the active layer 5 emits light.

In the semiconductor device 300 of the present invention, since the substrate 1 has the tilted surfaces 1b which are tilted with respect to an axis perpendicular to the primary surface 1a of the substrate 1, a crystal growth direction of the n-type GaN layer 2 is oriented toward a tilted direction in accordance with the tilt of the tilted surfaces 1b. Therefore, the linear lattice defects 110 also extend toward the above tilted direction, which leads to formation of a low-defect region 120 in the n-type GaN layer 2 which contains a relatively small (i.e., reduced) amount of lattice defects as compared to the surrounding regions. This low-defect region 120 is realized by the protrusion 300a which causes the linear lattice defects 110 perpendicular to the (0,0,0,1) plane of the substrate 1 to bend so as to orient in the crystal growth direction of the n-type GaN layer 2. Furthermore, the low-defect region 120 is also formed in the n-type AlGaN cladding layer 3, the n-type GaN light guiding layer 4, and the active layer 5.

When the active region 5a is positioned in the low-defect region 120, the fewer amount of linear lattice defects in the active region 5a can improve the reliability of the semiconductor device 300. It is preferable that the whole active region 5a is contained in the low-defect region 120. For example, when the active region 5a is formed directly above the convex portion 300a, it is possible to contain the whole active region 5a in the low-defect region 120, thereby significantly improving the reliability of the semiconductor device 300.

When the convex portions with the tilted surfaces are periodically provided in the upper surface of the substrate 1 so as to form periodic convex and concave configurations, it becomes possible to produce a plurality of the low-defect regions 120 periodically and also a plurality of the corresponding active regions 5a periodically. By providing these periodic convex portions, a plurality of semiconductor laser elements can be periodically formed on the substrate 1, resulting in an efficient fabrication thereof.

Figure 6A:
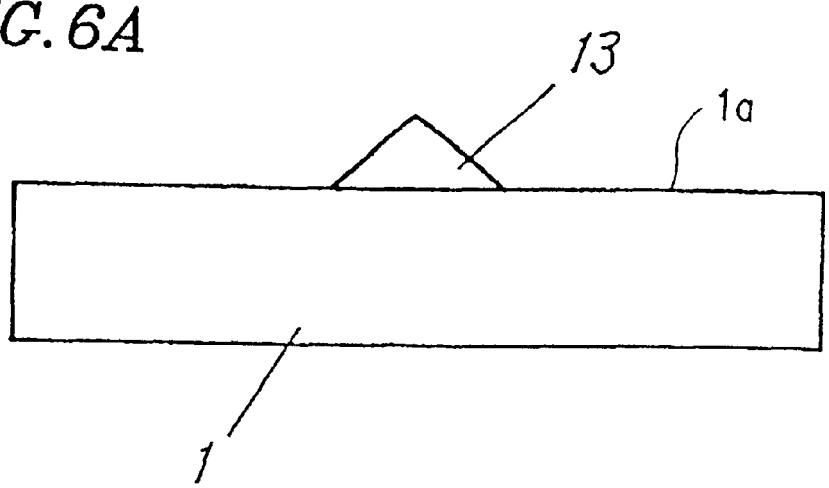
FIGS. 6A through 6C are partial cross-sectional views illustrating a method of fabricating the semiconductor device shown in FIG. 5.
Figure 6B:
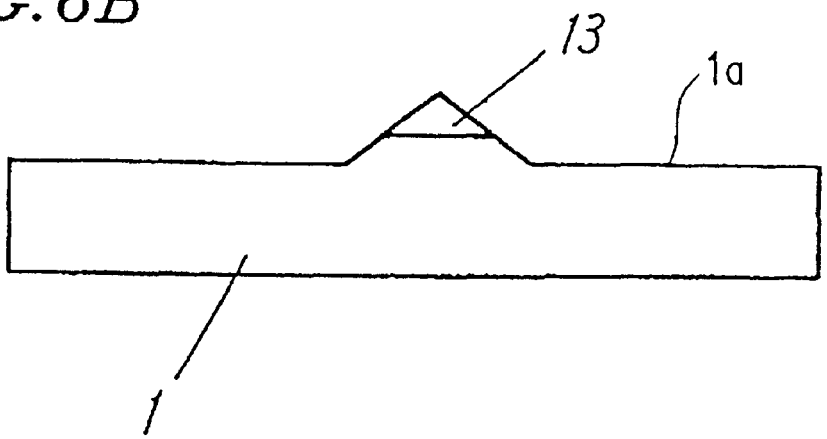
Figure 6C:
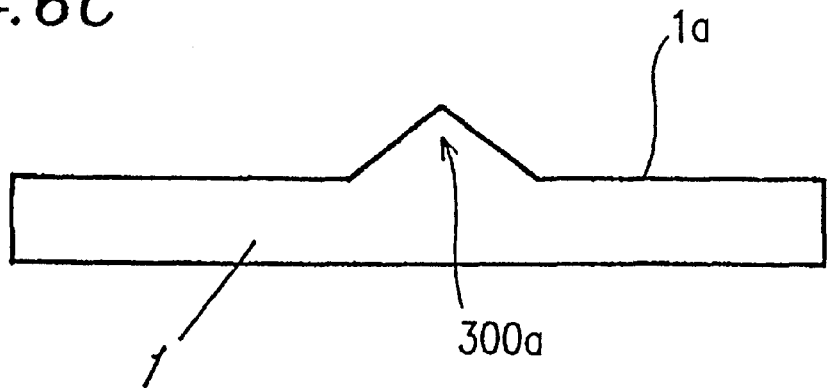

A method for fabricating the convex portion 300a will be described as follows. FIGS. 6A through 6C illustrate steps of processing the upper surface of the substrate 1.

First, as shown in FIG. 6A, a portion of the substrate 1 is covered with a mask 13. This mask 13 does not have a surface parallel to the primary surface 1a of the substrate 1. As shown in FIG. 6B, the mask 13 as well as the substrate 1 are then etched by dry etching. When the mask 13 is completely removed by etching, the convex portion 300a is formed on the substrate 1, as shown in FIG. 6C. The convex portion 300a does not have a surface parallel to the primary surface 1a of the substrate 1.

Examples of surface orientations of the substrate 1 include a (1,1,1) plane, (−1,1,1) plane, (1,−1,1) plane, (−1,−1,1) plane, (1,1,−1) plane, (−1,1,−1) plane, (1,−1,−1) plane, and (−1,−1,−1) plane of cubic crystal, or a (0,0,0,1) plane and (0,0,0,−1) plane of hexagonal crystal, or the like.

To produce the semiconductor device 300 according to the present invention, examples of a crystal growth method include MOCVD, MBE, HVPE, and a combination thereof.

The same life test as applied to the semiconductor device 100 in Example 1 was also conducted for the semiconductor device 300 according to the present example. A result of the life test showed that the semiconductor laser element according to the present example has a 2% increase in an operational current on average, thereby confirming a significant improvement in reliability.

EXAMPLE 4

A semiconductor device according to Example 4 of the present invention will be described below, along with a fabrication method thereof, with reference to FIGS. 7A through 7F.

Figure 7A:
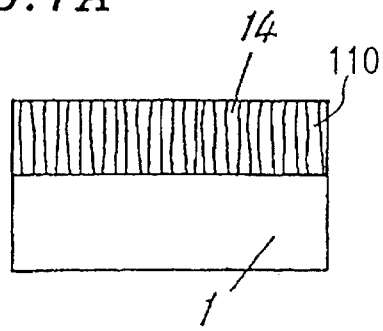
FIGS. 7A through 7F are cross-sectional views illustrating a method of fabricating a semiconductor device according to Example 4 of the present invention.

As illustrated in FIG. 7A, an AlN layer 14 with a thickness of 5 μm is formed on a sapphire (0,0,0,1) substrate 1 by MOCVD at a temperature of 1000° C. In the AlN layer 14, linear lattice defects 110 are generated due to a difference in a lattice constant between AlN and sapphire.

Figure 7B:
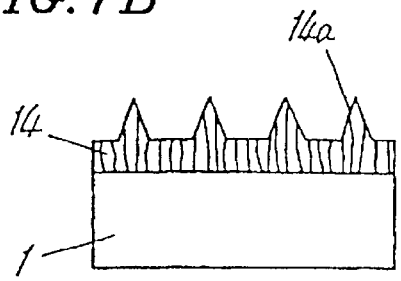

As shown in FIG. 7B, a concave and convex structure 14a providing tilted surfaces is then provided on an upper surface of the AlN layer 14 by reactive ion etching for serving as a first stepped configuration. The tilted surfaces of the concave and convex structure 14a do not have a (0,0,0,1) plane of the AlN layer 14. The tilted surfaces of the concave and convex structure 14a extend along a <1,1,−2,0> direction.

Figure 7C:
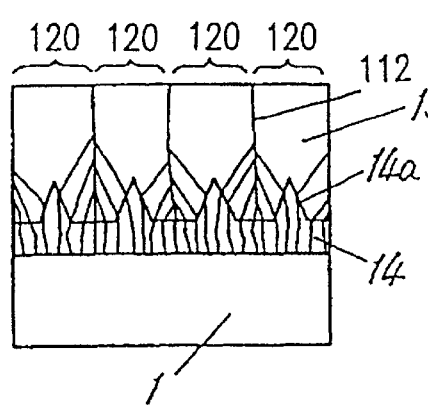

As shown in FIG. 7C, a GaN layer 15 with a thickness of 10 μm is formed on the AlN layer 14 by MOCVD. As the GaN layer 15 is deposited, substantially all of linear lattice defects 110 of the GaN layer 15 on the concave portion of the AlN layer 14 extend toward and reach a middle portion over the concave portion of the AlN layer 14, and finally merge with each other into a single linear lattice defect 112. In the thus formed GaN layer 15, the linear lattice defects 112 substantially only exist in the vicinity of the middle portion over the concave portion of the AlN layer 14. The remaining regions of the GaN layer 15 become low-defect regions 120.

Figure 7D:
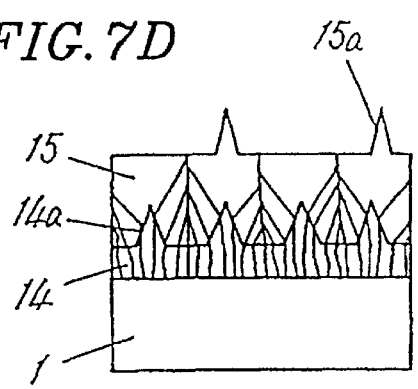
Figure 7E:
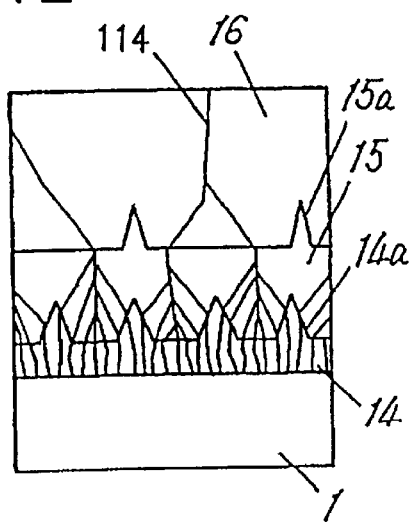

To further reduce the amount of the remaining lattice defects 112, as shown in FIG. 7D, another concave and convex structure 15a including convex portions not having a (0,0,0,1) plane is formed in an upper surface of the GaN layer 15 in such a way that the linear lattice defects 112 are positioned in the newly provided concave portions. In Example 4, the periodic interval of the concave and convex structure 15a is two times as large as that of the concave and convex structure 14a. Thereafter, as shown in FIG. 7E, a GaN layer 16 with a thickness of 20 μm is formed on the GaN layer 15 by HVPE. As the GaN layer 16 is deposited, substantially all of linear lattice defects of the GaN layer 16 originated from the linear lattice defects 112 extend toward and reach a middle portion over the concave portion of the concave and convex structure 15a, and finally merge with each other into a single linear lattice defect 114, thereby further reducing the amount of the linear lattice defects.

Figure 7F:
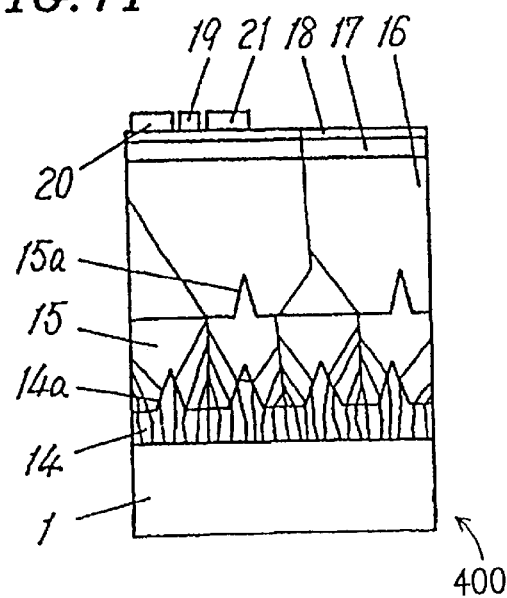

As shown in FIG. 7F, an undoped GaN layer 17 with a thickness of 2 μm and an n-type GaN layer 18 with a thickness of 100 Å are successively formed on the GaN layer 16 by MOCVD. On the n-type GaN layer 18, a gate electrode 19, a source electrode 20, and a drain electrode 21 are provided to obtain a complete semiconductor transistor element 400.

The highest operational frequency of the semiconductor device 400 according to Example 4 of the present invention is equal to that of the semiconductor device 200 according to Example 2. As compared with a conventional semiconductor device, the highest operational frequency of the semiconductor device 400 is enhanced due to a reduction of linear lattice defects.

A shape of the convex portion of the concave and convex structures 14a and 15a of Example 4 may be any shape that does not have a plane having the same orientation as that of the primary plane of the substrate 1, such as a sharp-pointed shape, a curved shape, or a combination of thereof. In those cases, the same reduction of linear lattice defects as described above is obtained. A shape of the concave portion of the concave and convex structures 14a and 15a of Example 4 may be any shape including a plane, a sharp-pointed shape, a curved surface, or a combination of thereof, or the like. In those cases, the same reduction of linear lattice defects as described above is obtained.

EXAMPLE 5

Figure 8:
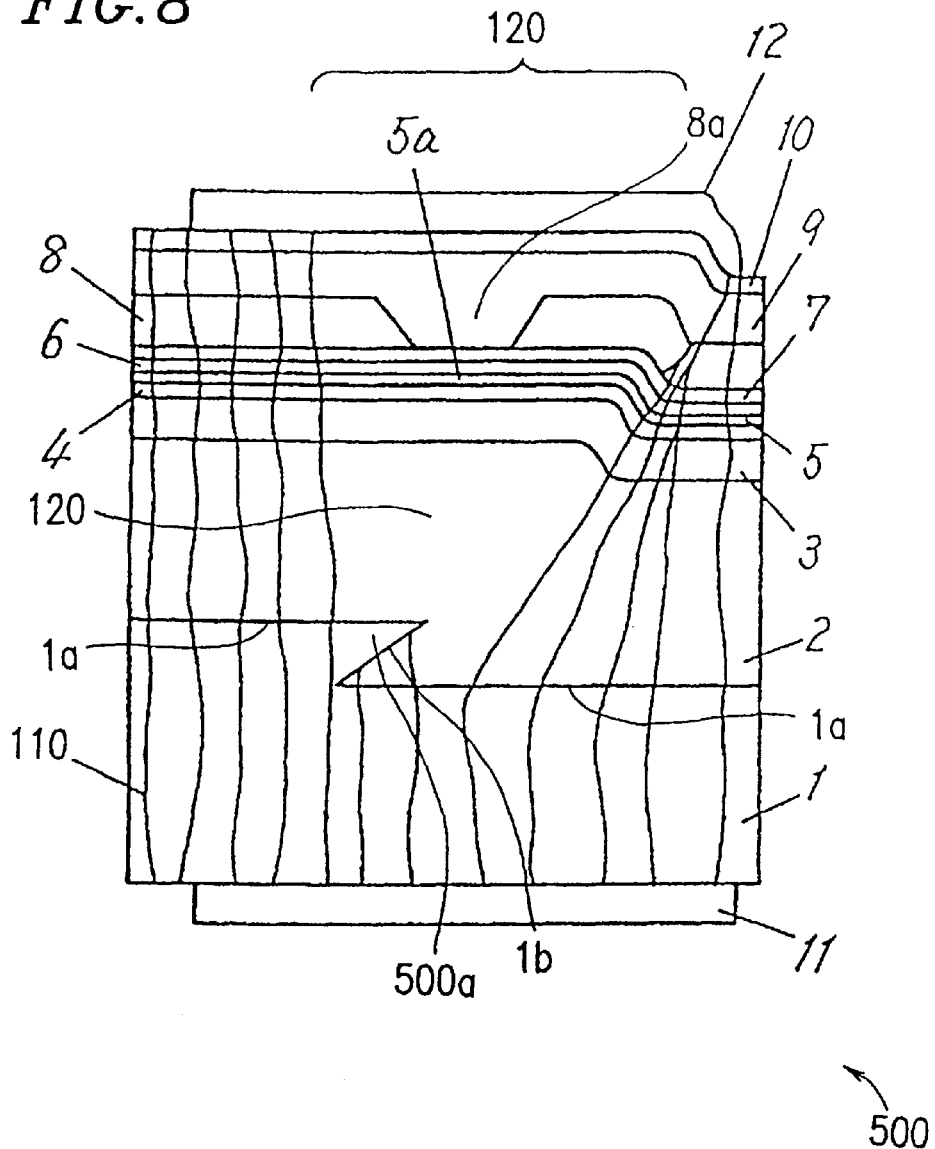
FIG. 8 is a cross-sectional view of a semiconductor device according to Example 5 of the present invention.

FIG. 8 is a cross-sectional view illustrating a semiconductor device 500 according to Example 5 of the present invention.

A substrate 1 is a hexagonal n-type GaN (0,0,0,1) substrate. A stepped portion 500a is provided to form a concave-and-convex configuration with a tilted surface such that an angle between a normal line of a tilted surface 1b of the stepped portion 500a and a normal line of a primary surface 1a of the substrate 1 is 90° or more. An upper surface of the substrate 1 includes a primary surface 1a and the tilted surface 1b.

An n-type GaN layer 2 with a thickness of 5 μm is formed on the substrate 1. On the n-type GaN layer 2, successively provided are an n-type AlGaN cladding layer 3 with a thickness of 0.5 μm (a mixed crystal ratio of Al to Ga is 10:90), an n-type GaN light guiding layer 4 with a thickness of 0.1 μm, an active layer 5 including an InGaN quantum well composed of InGaN layers (not shown) each with a thickness of 5 nm (a mixed crystal ratio of In to Ga is 5:95) and InGaN layer(s) (not shown) each with a thickness of 5 nm (a mixed crystal ratio of In to Ga is 15:85), a p-type GaN light guiding layer 6 with a thickness of 0.05 μm, a first p-type AlGaN cladding layer 7 with a thickness of 0.05 μm (a mixed crystal ratio of Al to Ga is 10:90), a current constriction layer 8 with a thickness of 0.5 μm including an opening 8a with a width of 2 μm. A portion of the active layer 5 in the vicinity of the opening 8a of the current constriction layer 8 includes an active region 5a of a semiconductor layer.

The current constriction layer 8 may be of a conductivity type opposite to that of the first p-type AlGaN cladding layer 7 or of high resistance. A material of the current constriction layer 8 may be a semiconductor material such as GaN and AlGaN, or an insulator material such as AlN and SiO$_2$.

On the current constriction layer 8, a second p-type AlGaN cladding layer 9 (a mixed crystal ratio of Al to Ga is 10:90) with a thickness of 1 μm and a p-type GaN contact layer 10 with a thickness of 0.1 μm are successively formed.

Furthermore, an n-type electrode 11 is attached to the lower surface of the substrate 1 while a p-type electrode 12 is attached to the upper surface of the p-type GaN contact layer 10. When a voltage is applied between the n-type electrode 11 and the p-type electrode 12, the active layer 5 emits light.

In the semiconductor device 500 of the present invention, due to the stepped portion 500a, a portion of linear lattice defects 110 existing in the substrate 1 is prevented from extending along a crystal growth direction of the n-type GaN layer 2. Thus, a low-defect region 120 which contains relatively fewer (i.e., reduced) amount of linear lattice defects than the surrounding regions is formed above the stepped portion 500a. Furthermore, the low-defect region 120 is also formed in the n-type AlGaN cladding layer 3, the n-type GaN light guiding layer 4, and the active layer 5. When the active region 5a is positioned in the low-defect region 120, the fewer amount of linear lattice defects in the active region 5a can improve the reliability of the semiconductor device 500.

It is preferable that the active region 5a is positioned in a flat portion of the active layer 5.

When the stepped portions 500a with the tilted surface are periodically provided in the upper surface of the substrate 1, it becomes possible to produce a plurality of the low-defect regions 120 periodically and also a plurality of the corresponding active regions 5a periodically. By providing these periodic stepped portions, a plurality of semiconductor laser elements can be periodically formed on the substrate 1, resulting in an efficient fabrication thereof.

Examples of orientations of the substrate 1 include a (1,1,1) plane, (−1,1,1) plane, (1,−1,1) plane, (−1,−1,1) plane, (1,1,−1) plane, (−1,1,−1) plane, (1,−1,−1) plane, and (−1,−1,−1) plane of cubic crystal, or a (0,0,0,1) plane and (0,0,0,−1) plane of hexagonal crystal, or the like.

In order to produce the semiconductor device 500, examples of a crystal growth method include MOCVD, MBE, HVPE, and a combination thereof.

The same life test as applied to the semiconductor device 100 in Example 1 was conducted for the semiconductor devices 500 according to the present example. A result of the life test showed that substantially all of the semiconductor devices according to the present example operated after 1000 hours passed since the start of operation, and have a 2% increase in an operational current on average, thereby showing that a significant improvement in reliability was obtained.

EXAMPLE 6

A semiconductor device according to Example 6 of the present invention will be described below, along with a fabrication method thereof, with reference to FIGS. 9A through 9F.

As illustrated in FIG. 9A, an AlN layer 14 with a thickness of 5 μm is formed on a sapphire (0,0,0,1) substrate 1 by MOCVD at a temperature of 1000° C. In the AlN layer 14, linear lattice defects 110 occur due to a difference in a lattice constant between AlN and sapphire.

As shown in FIG. 9B, a concave and convex structure 14a providing tilted surfaces is then provided on an upper surface of the AlN layer 14 for serving as a first stepped configuration. An angle between the normal line of the (0,0,0,1) plane of the substrate 1 and the normal line of a tilted surface 14b of a convex portion 600a is 90° or more. A periodic interval of the concave and convex structure 14a is 10 μm. A width of an upper surface 14c of the convex portion 600a is 2 μm. A height of the convex portion is 3 μm. The tilted surface 14b of the concave and convex structure 14a extends along a <1,1,−2,0> direction.

As shown in FIG. 9C, a GaN layer 15 with a thickness of 10 μm is formed on the AlN layer 14 by MOCVD. A portion of lattice defects 110 under the tilted surface 14b is prevented from extending through the tilted surface 14b of the convex portion 600a, and does not reach an upper surface of the GaN layer 15. As the GaN layer 15 is deposited, substantially all of linear lattice defects 110 of the GaN layer 15 on a concave portion 14c of the AlN layer 14 extend toward and reach a middle portion over the concave portion of the AlN layer 14, and finally merges with each other into a single lattice defect 112. In the thus formed GaN layer 15, the lattice defects substantially only exist in the vicinity of the middle portion over the concave portion 14c of the AlN layer 14 and in the vicinity of the middle portion over the protrusion 600a of the AlN layer 14. The remaining regions of the GaN layer 15 become low-defect regions 120.

To further reduce the amount of the remaining lattice defects 112, as shown in FIG. 9D, other convex portions 601a are formed in the GaN layer 15, respectively, over every two the low-defect regions 120 to produce another concave and convex structure 15a serving as a second stepped configuration. A periodic interval, width of a top surface of a convex portion, and depth of the concave and convex structure 15a are the same as those of the concave and convex structure 14a. Preferably, an angle between the normal line of the (0,0,0,1) plane of the substrate 1 and the normal line of a tilted surface 15b of the convex portion 601a is 90° or more.

Thereafter, as shown in FIG. 9E, a GaN layer 16 with a thickness of 20 μm is formed on the GaN layer 15 by HVPE. A portion of lattice defects 112 under the tilted surface 15b is prevented from extending through the tilted surface 15b of the convex portion 601a. As the GaN layer 16 is deposited, substantially all of linear lattice defects of the GaN layer 16 in the concave portion 15c extend toward and reach a middle portion over the concave portion 15c of the concave and convex structure 15a, and finally merge with each other into a single linear lattice defect 114, thereby further reducing the amount of the linear lattice defects.

As shown in FIG. 9F, an undoped GaN layer 17 with a thickness of 2 μm and an n-type GaN layer 18 with a thickness of 100 Å are successively formed on the GaN layer 16 by MOCVD. On the n-type GaN layer 18, a gate electrode 19, a source electrode 20, and a drain electrode 21 are provided to obtain a complete semiconductor transistor element 600.

The semiconductor device 600 according to Example 6 of the present invention has the highest operational frequency that is equal to that of the semiconductor device 200 according to Example 2. As in Example 2, the highest operational frequency of the semiconductor device 600 is enhanced because of increased electron mobility due to a reduction of the amount of the linear lattice defects.

EXAMPLE 7

A semiconductor laser device according to Example 7 of the present invention will be described below with reference to FIG. 10.

Figure 10:
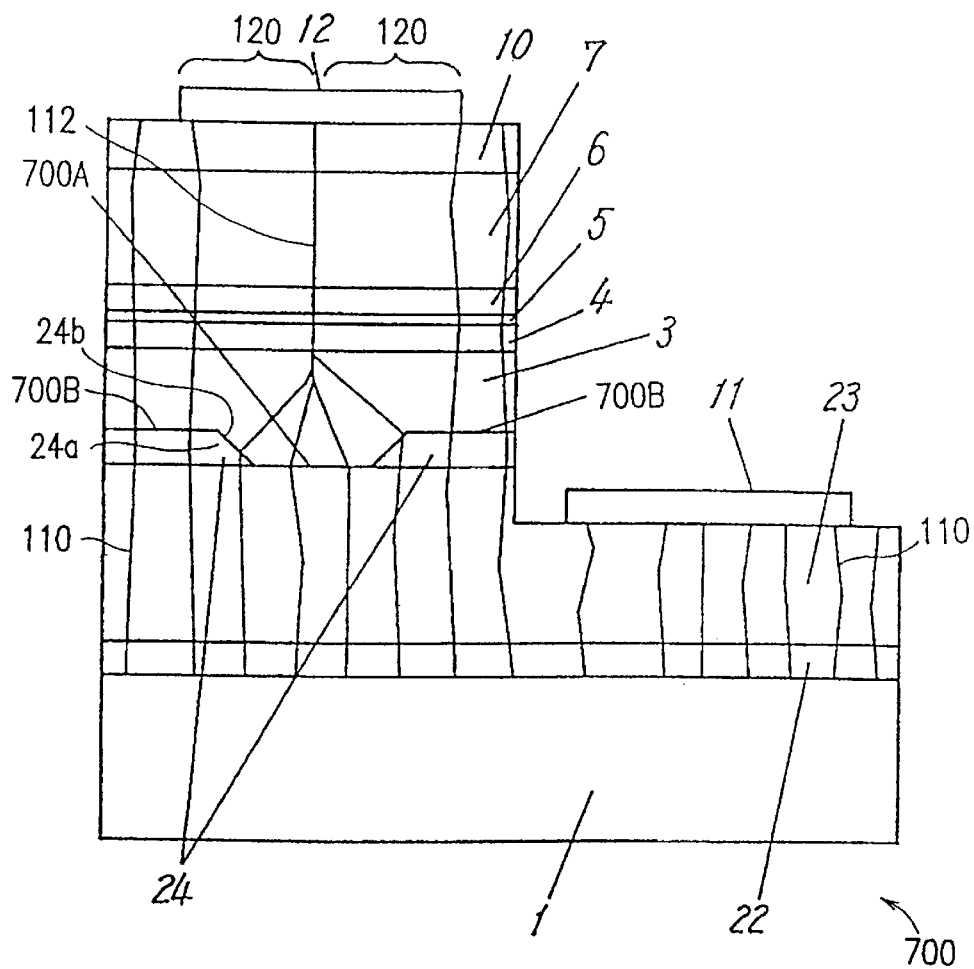
FIG. 10 is a cross-sectional view of a semiconductor device according to Example 7 of the present invention.

Referring to FIG. 10, on a (0,0,0,1) substrate 1 of hexagonal sapphire, an AlN buffer layer 22 with a thickness of 0.05 μm, an n-type GaN layer 23 with a thickness of 1.0 μm, and a high-resistance $Al_{0.2}Ga_{0.8}N$ current blocking layer 24 with a thickness of 0.5 μm which has a window portion 700a in the shape of a stripe with a width of 1.5 μm are formed. The window portion 700a provides tilted surfaces which are tilted with respect to upper surfaces of the current blocking layer 24. Linear lattice defects 110 extending substantially along a normal line of the substrate 1 are formed in the AlN buffer layer 22, the n-type GaN layer 23, and the current blocking layer 24.

An n-type $Al_{0.1}Ga_{0.9}N$ cladding layer 3 is formed over the window portion 700a and upper surface 700b of the current blocking layer 24. Furthermore, on the cladding layer 3, successively provided are an n-type GaN light guiding layer 4 with a thickness of 0.1 μm, an active layer 5 including an InGaN quantum well composed of $In_{0.05}Ga_{0.95}N$ layer(s) (not shown) each with a thickness of 5 nm and $In_{0.15}Ga_{0.85}N$ layer(s) (not shown) each with a thickness of 5 nm, a p-type GaN light guiding layer 6 with a thickness of 0.05 μm, a p-type $Al_{0.1}Ga_{0.9}N$ cladding layer 7 with a thickness of 0.8 μm, and a p-type GaN contact layer 10 with a thickness of 0.5 μm.

Furthermore, ohmic electrodes 11 and 12 are formed on the n-type GaN layer 23 and the p-type GaN contact layer 10, respectively. When a current passes between the ohmic electrodes 11 and 12, a portion of the active layer 5 directly above the window portion 700a which is an active region emits light. When the current is sufficiently increased, laser oscillation occurs.

In Example 7, the current blocking layer 24 has the window portion 700a which includes stepped portions 24a. A crystal growth direction of the cladding layer 3 is tilted due to a tilted surface 24b of the stepped portion 24a of the window portion 700a. Accordingly, linear lattice defects 110 at the window 700a also extend in a tilted direction in accordance with the tilt of the tilted surface 24b of the stepped portion 24a, thereby fabricating a low-defect region 120 where there is a relatively small amount of lattice defects. The linear lattice defects extend from both sides of the window 700a toward a middle portion over the window portion 700a, and merge with each other into a single linear lattice defect 112, thereby reducing the number of the linear lattice defects 110. As a result, the number of the lattice defects 110 which pass through the active region is further reduced as compared to when the window portion 700a is not provided, thereby improving a life of the semiconductor laser device 700.

When a number of the semiconductor devices 700 of the present example were continuously operated to output a constant power of light at 30 mW at a temperature of 100° C., substantially all of the semiconductor devices 700 stably operated with an increased operational current by 2% or less after 1000 hours passed since the start of operation. Thus, a large improvement in the reliability of the semiconductor device 700 was confirmed.

In the above-described semiconductor device 700, the current blocking layer 24 is made of AlGaN in which a mole fraction of Al in the composition is higher than that in the cladding layer 3. When the current blocking layer 24 has an AlGaN composition including an Al mole fraction equal to or smaller than that of the cladding layer 3, the number of linear lattice defects which pass through the active layer 5 is also reduced, thereby improving the reliability of the semiconductor device 700. Moreover, a refractive index of the window portion 700a can be set higher than that of the current blocking layer 24 so that an effective refractive index difference is generated between the window portion 700a and the current blocking layer 24. Therefore, it is possible to confine light generated in the active layer 5 within a stripe of the window portion 700a, thereby reducing a threshold of a current required to generate laser oscillation.

In the semiconductor laser device 700 of Example 7, the current blocking layer 24 is of high resistance, but may be of p-type where the same effects as described above can be obtained.

Furthermore, each layer may have reversed conductivity from the above-described corresponding layer. That is, the GaN layer 23 and the cladding layer 3 may be of p-type; the current blocking layer may be of high resistance or of n-type; and the cladding layer 7 and the contact layer 10 may be an n-type nitride compound semiconductor.

Furthermore, although the active layer 5 is made of InGaN and the other layers are made of $Al_xGa_{1-x}N$ ($0 \leq x \leq 1$), each layer may be generally made of nitride compound semiconductor represented by $B_uAl_vGa_wIn_{1-u-v-w}N$ ($0 \leq u \leq 1$, $0 \leq v \leq 1$, $0 \leq w \leq 1$).

EXAMPLE 8

Figure 11:
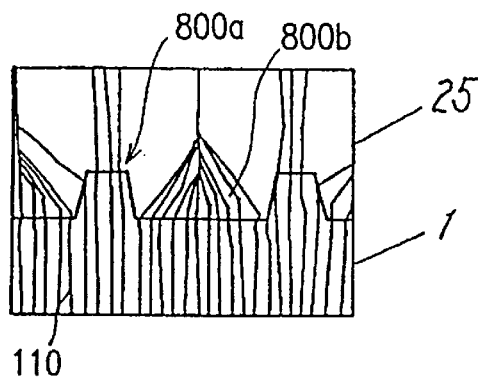
FIG. 11 is a cross-sectional view of a semiconductor substrate according to Example 8 of the present invention.

FIG. 11 is a cross-sectional view illustrating a semiconductor substrate according to Example 8 of the present invention. A method for fabricating this semiconductor substrate will be described below with reference to FIGS. 12A through 12D.

Figure 12A:
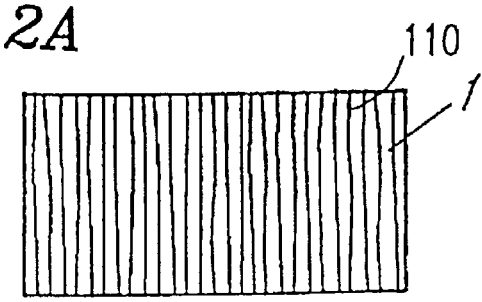
FIGS. 12A through 12D are cross-sectional views illustrating a method of fabricating the semiconductor substrate shown in FIG. 11.
Figure 12B:
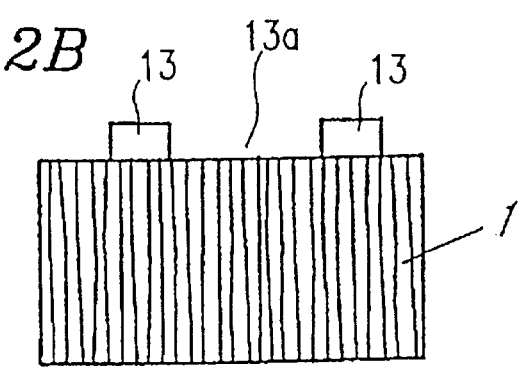

FIG. 12A shows a hexagonal crystalline GaN (0,0,0,1) substrate 1 where liner dislocations 110 reach an upper surface of the substrate 1 and have a density of about $1 \times 10^8$ $cm^{-2}$. A mask 13 made of photoresist is provided on the substrate 1 using photolithography as shown in FIG. 12B. In this example, the mask 13 has a width of 8 μm, and an opening 13a with a width of 16 μm.

Figure 12C:
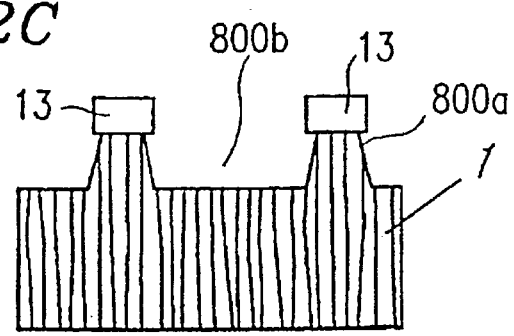

By reactive ion etching using a $BCl_3$ gas, the substrate 1 is etched away to a depth of 1 μm only under the opening 13a of the mask 13. Consequently, a concave and convex structure is produced so as to have periodic convex portions (ridges) 800a, each having a forward mesa structure with a width of 7 μm and a height of 1 μm and providing tilted surfaces, and concave portions 800b each with a width of 17 μm, as shown in FIG. 12C. The width of the convex portion 800a becomes smaller than the width of the mask 13, because a portion of the substrate 1 under the mask 13 is side-etched.

Figure 12D:
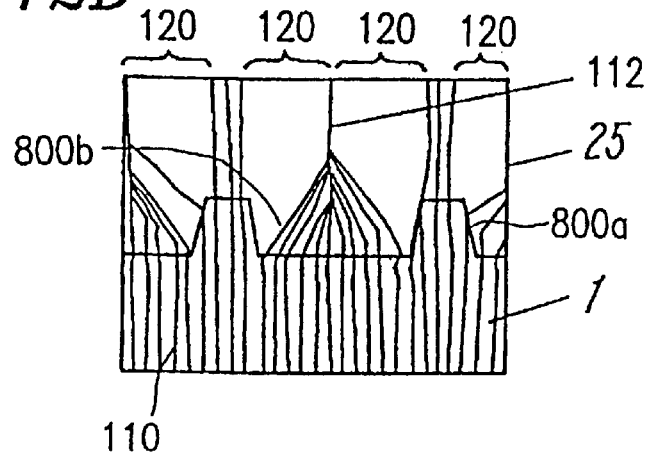

After removal of the mask 13, a GaN layer 25 is grown so as to cover the concave portions 800b and the convex portions 800a. For the growth of the GaN layer 25, MOCVD equipment can be used, but it is not limited thereto. Source materials for the GaN layer 25 are, for example, trimethylgallium and ammonia, and hydrogen is used as a carrier gas. Trimethylgallium and ammonia are introduced into a growth chamber of the MOCVD equipment under such conditions that a mole supply ratio of trimetylgallium and ammonia is Ga:N=1:5500 and a temperature in the growth chamber is 1000° C. The GaN layer 25 is grown for 3 hours at a growth rate of 2 μm per hour on the (0,0,0,1) plane of the substrate 1 (FIG. 12D).

In the above growth process, the linear lattice defects originated from the substrate 1 merges into a streak 112 in the GaN layer 25. Accordingly, low-defect regions 120 are formed in the GaN layer 25, resulting in the same structure as shown in FIG. 11.

A material of the mask 13 may be $SiO_2$ or Au other than the photoresist indicated in the above. Other than $BCl_3$ indicated in the above, a gas used for reactive ion etching may be a gas including chlorine, such as $Cl_2$ or $SiCl_4$.

EXAMPLE 9

Figure 13:
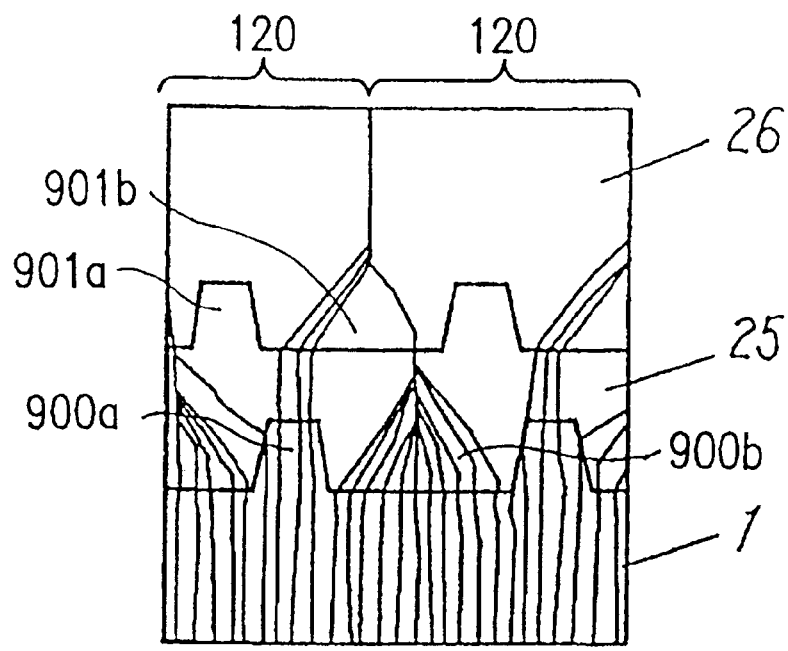
FIG. 13 is a cross-sectional view of a semi conductor substrate according to Example 9 of the present invention.

FIG. 13 is a cross-sectional view illustrating a semiconductor substrate according to Example 9 of the present invention.

Using the same procedure as described in Example 8, a first concave and convex structure is produced to include first periodic convex portion 900a, each having a forward mesa structure with a width of 7 µm and a height of 1 µm and providing tilted surfaces, and first concave portions 900b each with a width of 17 µm. A GaN layer 25 is then grown, thereon for 3 hours. Thereafter, in the same way as used for forming the first concave and convex structure, a second concave and convex structure is produced to include second periodic convex portions 901a each having a forward mesa structure with a width of 7 µm and a height of 1 µm, providing tilted surfaces, and second concave portions 901b each with a width of 17 µm. In this case, the second convex portion 901a is contained at least partially, but preferably completely, in a low-defect region 120. In Example 9, the second convex portion 901a is laterally shifted by 8 µm with respect to the corresponding convex portion 900a as shown in FIG. 13 so that the second convex portion 901a is completely contained in the low-defect region 120. A GaN layer 26 is then grown on the GaN layer 25 for 3 hours under the same conditions as used for the GaN layer 25.

As described above, by providing the second concave and convex structure, the GaN layer 26 is allowed to have larger low-defect regions than those of the GaN layer 25.

EXAMPLE 10

Figure 14:
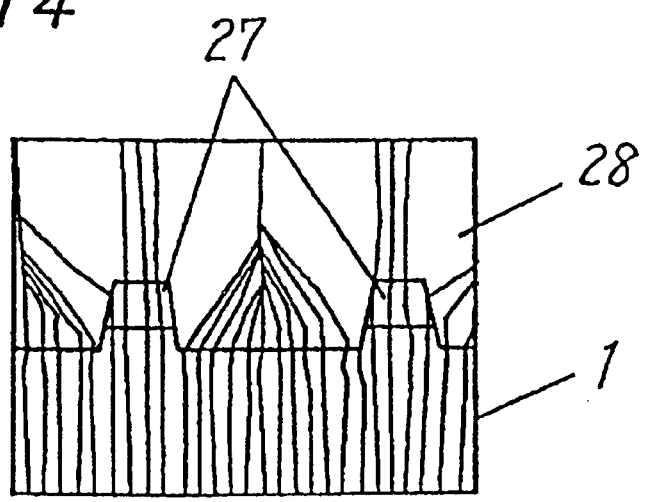
FIG. 14 is a cross-sectional view of a semiconductor substrate according to Example 10 of the present invention.

FIG. 14 is a cross-sectional view illustrating a semiconductor substrate according to Example 10 of the present invention. A method for fabricating this semiconductor substrate will be described below with reference to FIGS. 15A through 15E.

FIG. 15A shows a hexagonal crystalline GaN (0,0,0,1) substrate 1. As shown in FIG. 15B, an $Al_{0.5}Ga_{0.5}N$ layer 27 with a thickness of 1.5 µm is grown on the substrate 1. For this growth, the same MOCVD equipment as used in Example 8 can be used, but it is not limited thereto. Source materials of the $Al_{0.5}Ga_{0.5}N$ layer 27 are, for example, trimethylgallium, trimethylaluminium and ammonia, and a supplied gas including these source materials has a mole supply ratio of Ga:Al:N=0.5:0.5:5500. In this case, the resultant $Al_{0.5}Ga_{0.5}N$ layer 27 has a flat surface without a crack.

Thereafter, as shown in FIG. 15C(a), convex portions providing tilted surfaces, i.e., protrusions 27a each having a forward mesa structure with a height of 2 µm are formed in the $Al_{0.5}Ga_{0.5}N$ layer 27 by the same reactive ion etching as described in Example 8. The protrusions 27a are arranged in a checker board pattern as shown in FIG. 15C(b). A depth of the protrusion 27a is larger than that of the $Al_{0.5}Ga_{0.5}N$ layer 27, so that a bottom of the protrusion 27a reaches the GaN substrate 1. An $Al_{0.5}Ga_{0.5}N$ layer 28 with a thickness of 30 µm is grown on the $Al_{0.5}Ga_{0.5}N$ 27 as shown in FIG. 15D. In this case, low-defect regions 120 are produced as described in Example 8.

When a height of the protrusion 27a is 1 µm, a bottom of the protrusion 27a does not reach the substrate 1 and thus the substrate 1 is not exposed. Since the thickness 30 µm is considerably thick, a difference in a lattice constant between GaN and $Al_{0.5}Ga_{0.5}N$ causes cracks in a surface of the $Al_{0.5}Ga_{0.5}N$ layer 28.

As described above, when a height of the protrusion 27a is larger than a thickness of the $Al_{0.5}Ga_{0.5}N$ layer 27, a crack does not occur in a surface of the $Al_{0.5}Ga_{0.5}N$ layer 28. This case will be described in greater detail.

As shown in FIG. 15E in which lattices are schematically illustrated with lines 210, lattice mismatch between the protrusion 27a and the GaN substrate 1 is relieved when the $Al_{0.5}Ga_{0.5}N$ layer 27 is formed in a checker board pattern. Whereas a lattice match is established at an interface between the $Al_{0.5}Ga_{0.5}N$ layer 27 and the $Al_{0.5}Ga_{0.5}N$ layer 28, a lattice mismatch occurs at an interface between the GaN substrate 1 and the $Al_{0.5}Ga_{0.5}N$ layer 28. Thus, when the protrusion 27a is formed beyond the $Al_{0.5}Ga_{0.5}N$ layer 27, a difference in a lattice constant between the GaN substrate 1 and the $Al_{0.5}Ga_{0.5}N$ layer 28 is reduced, thereby preventing a crack from occurring in the $Al_{0.5}Ga_{0.5}N$ layer 28. In view of the above-described mechanism, the same effects as described above are obtained when the semiconductor layers 27 and 28 are made of AlGaN having a different composition from $Al_{0.5}Ga_{0.5}N$, or further, made of other materials.

EXAMPLE 11

A semiconductor device according to Example 11 of the present invention will be described below with reference to FIGS. 16A through 16C and FIGS. 17A through 17C.

In this example, semiconductor devices according to the present invention were produced using a GaN crystalline substrate, an $Al_{0.5}Ga_{0.5}N$ crystalline substrate, or an AlN crystalline substrate as a crystalline substrate 1, each of which has a defect density of about $1 \times 10^8$ $cm^{-2}$, and GaN, $Al_{0.5}Ga_{0.5}N$, or AlN as a semiconductor layer 25. The same life test as described in Example 1 was conducted for all possible combinations of the above-mentioned substrate 1 and semiconductor layer 25. A temperature for growth of the semiconductor layer 25 was in a range of 700° C. to about 1100° C.

Figure 16A:
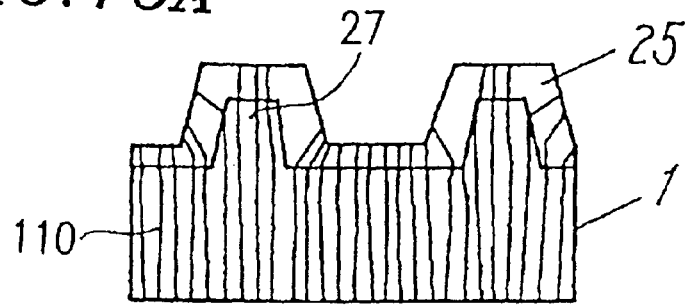
FIGS. 16A through 16C are cross-sectional views of the semiconductor device shown in FIG. 15D showing a state of lattice defects when a growth temperature is more than about 900° C.
Figure 16B:
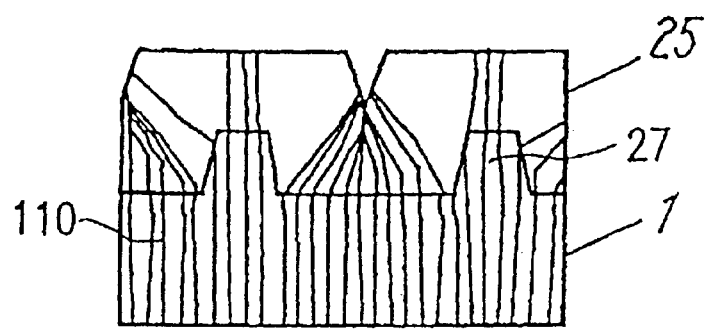
Figure 16C:
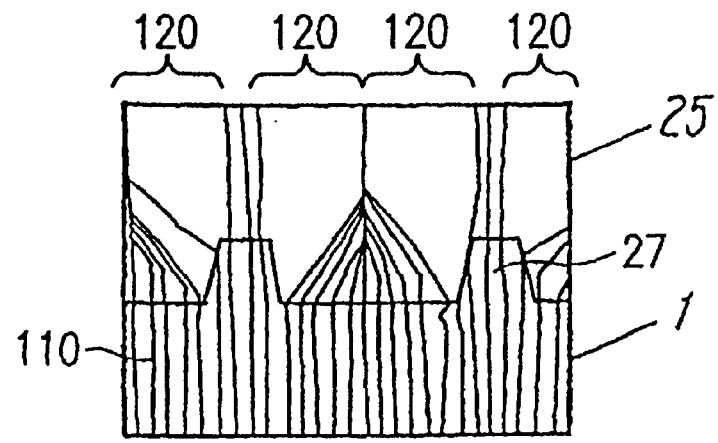

In any of the above-described combinations, when a temperature for growth of the semiconductor layer 25 exceeds about 900° C., a convex portion 27 having a forward mesa structure with tilted surfaces is buried in the growing semiconductor layer 25 as shown in FIGS. 16A and 16B, and an upper surface of the resultant semiconductor layer 25 becomes flat as shown in FIG. 16C, while lattice defects 110 bend so that low-defect regions 120 are produced in the semiconductor layer 25. However, in any of the above-described combinations, when a temperature for growth of the semiconductor layer 25 is about 900° C. or less, a growth process proceeds so that an upper surface of the grown semiconductor layer 25 does not become flat due to the underlying convex portion 27 having a forward mesa structure, and lattice defects 110 do not bend, as sequentially shown in FIGS. 17A, 17B, and 17C. In this case, there is substantially no reduction of lattice defects 110.

As described above, when the semiconductor layer 25 made of any of the above-described materials is grown on the substrate 1 that is made of any of the above-described materials and has the convex portion 27, a temperature of growth of the semiconductor layer 25 is required to exceed about 900° C. so that an upper surface of the semiconductor layer 25 becomes flat and the lattice defects 110 are allowed to laterally bend.

EXAMPLE 12

A semiconductor device according to Example 12 will be described below with reference to FIG. 18.

Figure 18:
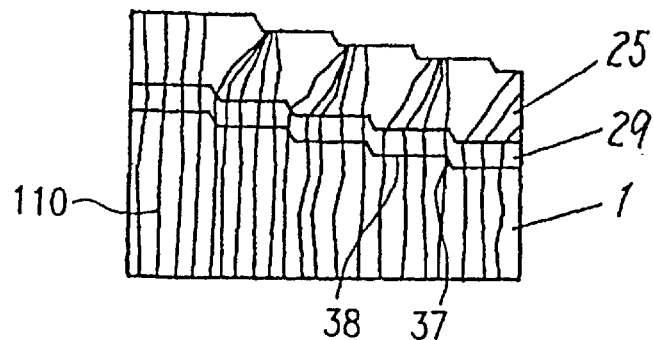
FIG. 18 is a cross-sectional view of a semiconductor device according to Example 12 of the present invention.

A substrate 1 shown in FIG. 18 is made of sapphire and includes steps. The substrate 1 is produced by heating a sapphire substrate having an upper surface tilted by 2° at a temperature of 1300° C. for 10 hours under a reducing atmosphere such as a hydrogen gas atmosphere. In such a heating process, microsteps of the order of atoms in the tilted upper surface of the substrate 1 are combined with each other, thereby fabricating steps 38 each exhibiting a tilted surface 37 and having a difference in level of 0.1 μm or more.

An experiment was conducted for growing an $Al_{0.5}Ga_{0.5}N$ layer 29 on the substrate 1 at a temperature in a range of 350° C. to 1000° C. When the temperature was less than 400° C., the $Al_{0.5}Ga_{0.5}N$ layer 29 did not grow. When the temperature was more than about 900° C., the $Al_{0.5}Ga_{0.5}N$ layer 29 grew in an island-like shape. Therefore, a temperature of growth of the $Al_{0.5}Ga_{0.5}N$ layer 29 is preferably set between about 400° C. and about 900° C.

When the growth temperature of the $Al_{0.5}Ga_{0.5}N$ layer 29 is about 900° C. or less, a lattice defect 110 does not bend and thus a low-defect region is not produced as described above in Example 11. For this reason, after the growth of the $Al_{0.5}Ga_{0.5}N$ layer 29, the $Al_{0.5}Ga_{0.5}N$ layer 25 is grown at a temperature of about 900° C. or more, whereby lattice defects 110 bend and low-defect regions 120 are produced.

Although the tilted surfaces 37 are produced by heating in reducing atmosphere as described above, the tilted surfaces 37 can be produced by a method such as the same etching as described above in Example 8. By etching or the like, a tilted surface in any shape can be produced on a substrate having any surface orientation.

Although both the semiconductor layers 29 and 25 are made of $Al_{0.5}Ga_{0.5}N$ as described above, materials of the semiconductor layers 29 and 25 may be AlGaN having a different composition from the above, or GaN or AlN. The semiconductor layers 29 and 25 may be made of different materials from each other.

A thickness of the semiconductor layer 25 is set so that the semiconductor layer 25 is grown to be a continuous layer. For example, a thickness of the semiconductor layer 25 is preferably 0.005 μm or more.

In accordance with the present example, an upper surface of the $Al_{0.5}Ga_{0.5}N$ layer 25 exhibits steps, as described above. When a flat-surfaced substrate is required for fabricating a semiconductor device or the like, an upper surface of the resultant $Al_{0.5}Ga_{0.5}N$ layer 25 is made flat by polishing or the like.

EXAMPLE 13

A semiconductor device according to Example 13 will be described below with reference again to FIG. 18.

In Example 13, as shown in FIG. 18, an $Al_{0.5}Ga_{0.5}N$ layer 29 and an $Al_{0.5}Ga_{0.5}N$ layer 25 are grown on a substrate 1 in the same way as described in Example 12, except that a (0,0,0,1) 6H—SiC substrate, a (1,1,1) Si substrate, or a (1,1,1) GaAs substrate is used as the substrate 1. Steps 38 with tilted surfaces can be readily produced in the substrate 1 made of SiC, Si, or GaAs by appropriate wet etching, since these are semiconductor materials.

An experiment was conducted for growing an $Al_{0.5}Ga_{0.5}N$ layer 29 on the substrate 1 at a temperature in a range of 350° C. to 1000° C. When the temperature was less than 400° C., the $Al_{0.5}Ga_{0.5}N$ layer 29 was not grown. When the temperature was more than about 900° C., the $Al_{0.5}Ga_{0.5}N$ layer 29 was not grown to be a continuous layer. Therefore, a temperature of growth of the $Al_{0.5}Ga_{0.5}N$ layer 29 is preferably set between about 400° C. and about 900° C.

When the growth temperature of the $Al_{0.5}Ga_{0.5}N$ layer 29 is about 900° C. or less, a lattice defect 110 does not bend and thus a low-defect region is not produced as described above in Example 11. For this reason, after growth of the $Al_{0.5}Ga_{0.5}N$ layer 29, the $Al_{0.5}Ga_{0.5}N$ layer 25 is grown at a temperature of 900° C. or more, whereby lattice defects 110 bend and low-defect regions 120 are produced.

Although a certain surface orientation of the substrate 1 which allows a semiconductor layer with the certain orientation to be grown thereon is specified in Example 14, any surface orientation can lead to the same effects as described above. As for SiC, any other crystalline structure such as 4H—SiC and 3C—SiC may be used other than 6H—SiC.

Although the semiconductor layers 29 and 25 are made of $Al_{0.5}Ga_{0.5}N$ as described above, materials of the semiconductor layers 29 and 25 may be AlGaN having a different composition from the above, or GaN or AlN. The semiconductor layers 29 and 25 may be made of different materials from each other.

EXAMPLE 14

A semiconductor device according to Example 14 will be described below.

In the same way as described in Example 8 with reference to FIG. 11, convex portions (ridges) 800a in the shape of a stripe are periodically provided on a hexagonal GaN (0,0,0,1) substrate 1 (see FIG. 11).

An $Al_{0.2}Ga_{0.8}N$ layer 25 with a thickness of 6 μm is grown on the substrate 1 so as to cover the ridges 800a. When growing the $Al_{0.2}Ga_{0.8}N$ layer 25, a material containing Si, Se, Mg, or Zn is used to introduce impurities into the $Al_{0.2}Ga_{0.8}N$ layer 25. For the growth, the same MOCVD equipment as described in Example 1 can be used. As the source materials for supplying the above impurities, monosilane ($SiH_4$), hydrogen selenide ($H_2Se$), biscyclopentadienyl-magnesium (($C_5H_5)_2$ Mg), dimethylzinc (($CH_3)_2Zn$) are used.

A relationship between an impurity concentration in the $Al_{0.2}Ga_{0.8}N$ layer 25 and a surface state of the ridge 800a was studied. As a result, it was found that when an impurity concentration is more than about $1 \times 10^{21}$ cm$^{-3}$, concave portions and convex portions each having a size on the order of hundreds of nm were generated on a surface of the ridge 800a. Such concave portions and convex portions lead to poor flatness of the $Al_{0.2}Ga_{0.8}N$ layer 25. In this case, desirable characteristics of the semiconductor device cannot be obtained.

Consequently, an impurity concentration is required to be about $1 \times 10^{21}$ cm$^{-3}$ or less for fabricating a substrate used for a semiconductor device or the like.

A material containing the impurity is not limited to those described above. The impurity may be one of IV group elements such as Ge instead of Si, one of VI group elements such as O and S instead of Se, or one of II group elements such as Cd instead of Mg and Zn. Furthermore, the semiconductor layer 25 may be AlGaN, GaN, or AlN each having any composition, instead of above-mentioned $Al_{0.2}Ga_{0.8}N$.

EXAMPLE 15

A semiconductor device according to Example 15 of the present invention will be described below.

In the same way as described in Example 8, convex portions (ridges) 800a in the shape of a stripe are periodically provided on a hexagonal GaN (0,0,0,1) substrate 1 (see FIG. 11).

An $Al_{0.2}Ga_{0.8}N$ layer 25 is grown on the substrate 1 in a way to cover the ridges 800a. When growing the $Al_{0.2}Ga_{0.8}N$ layer 25, a ratio between a mole supply amount of N (i.e., a mole supply amount of a V group element) and a total mole supply amount of Ga and Al (i.e., a mole supply amount of III group elements) is set such that a ratio of a mole flow rate of V group elements to a mole flow rate of III group elements (hereinafter referred to as the V/III ratio) is in a range of 100 to 10000. In this case, a mole flow rate of the III group elements is constant. A growth temperature is in a range of 900° C. to 1100° C.

Figure 17A:
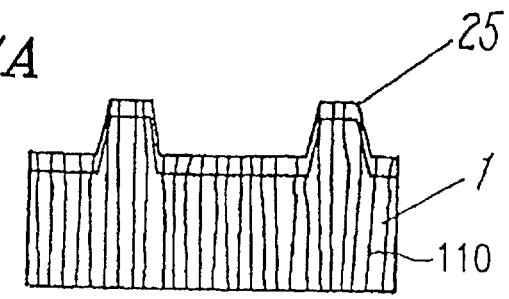
FIGS. 17A through 17C are cross-sectional views of the semiconductor device shown in FIG. 15D showing a state of lattice defects when a growth temperature is about 900° C. or less.
Figure 17B:
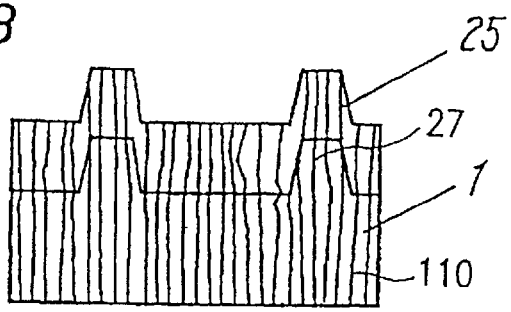
Figure 17C:
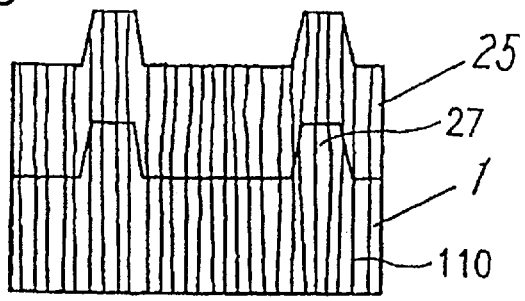
Figure 19:
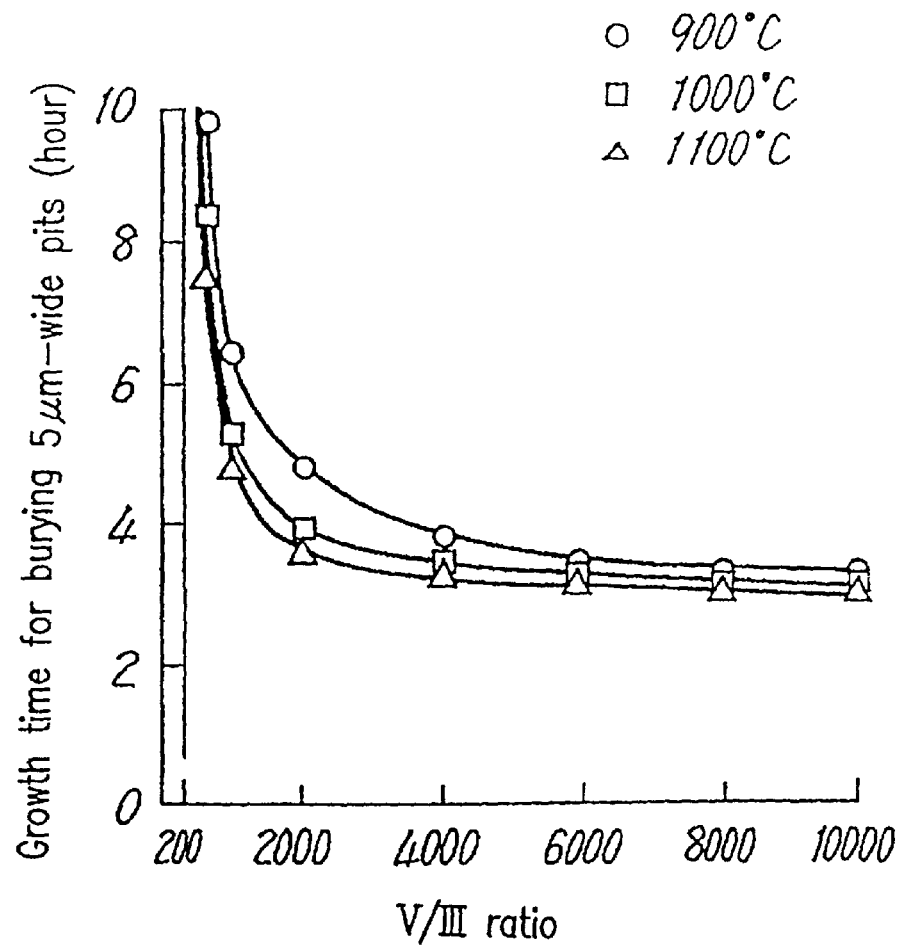
FIG. 19 is a graph showing a relationship between a material ratio and growth time of a semiconductor device according to Example 15 of the present invention.

A relationship between the V/III ratio and a period of time necessary for growing the $Al_{0.2}Ga_{0.8}N$ layer 25 in such a way that a concave portion 800b with a width of 5 μm is buried and an upper surface of the $Al_{0.2}Ga_{0.8}N$ layer 25 is made flat (hereinafter referred to as the "preferable growth time") was studied. A result of this study is shown in FIG. 19. For any growth temperature in the above-described range, when the V/III ratio is decreased, the preferable growth time is increased. When the V/III ratio is about 200 or less, growth of the $Al_{0.2}Ga_{0.8}N$ layer 25 is the same as described in FIGS. 17A through 17C. That is, an upper surface of the $Al_{0.2}Ga_{0.8}N$ layer 25 is not made flat. In this case, a low-defect region is not produced as shown in FIGS. 17A through 17C. To produce a low-defect region, the V/III ratio is required to be about 200 or more, preferably about 1000 or more.

Although the semiconductor layer 25 is made of $Al_{0.2}Ga_{0.8}N$, a material of the semiconductor layer 25 may be AlGaN having a different composition from the above, or GaN or AlN.

Various other modifications will be apparent to and can be readily made by those skilled in the art without departing from the scope and spirit of this invention. Accordingly, it is not intended that the scope of the claims appended hereto be limited to the description as set forth herein, but rather that the claims be broadly construed.

What is claimed is:

1. A method for fabricating a semiconductor device, comprising the steps of:
   forming a crystal plane on a primary surface of a substrate of a III group nitride compound material to provide a stepped portion so that a surface orientation of the crystal plane is different from a surface orientation of the primary surface of the substrate; wherein the primary surface is in a convex configuration with respect to the crystal plane; wherein the crystal plane forming step includes the steps of forming a mask having a predetermined pattern on the substrate, selectively etching a portion of the substrate not covered with the mask, and removing the mask; and
   forming a semiconductor layered structure made of a III group nitride compound material directly on both the crystal plane and the primary surface of the substrate, wherein the crystal plane is formed so as to be a tilted surface with respect to the primary surface, whereby a low-defect region in the semiconductor layered structure is provided containing fewer defects as compared to surrounding regions.

2. A method according to claim 1, wherein the substrate is made of $Al_xGa_{1-x}N$ ($0 \leq x \leq 1$), and the semiconductor layered structure forming step includes the step of forming an $Al_yGa_{1-y}N$ layer ($0 \leq y \leq 1$) at a crystal growth temperature of about 900° C. or more.

3. A method according to claim 1, wherein the semiconductor layered structure forming step includes the steps of: forming over the substrate, a first $Al_aGa_{1-a}N$ layer ($0 \leq a \leq 1$) at a crystal growth temperature in a range of about 400° C. to about 900° C.; and forming Over the first $Al_aGa_{1-a}N$ layer, a second $Al_aGa_{1-a}N$ layer ($0 \leq b \leq 1$) at a crystal growth temperature of about 900° C. or more.

4. A method according to claim 1, wherein the semiconductor layered structure forming step includes the step of introducing an impurity to a predetermined portion of the semiconductor layered structure at a concentration of about $10^{21}$ cm$^{-3}$ or less.

5. A method according to claim 1, wherein in the semiconductor layered structure forming step, a mole supply ratio of a V group source material to a III group source material (a V/III ratio) is about 200 or more.

6. A method for fabricating a semiconductor device, comprising the steps of:
   forming a first crystal plane on a primary surface of a substrate of a III group nitride compound material to provide a stepped portion so that a surface orientation of the first crystal plane is different from a surface orientation of the primary surface of the substrate; wherein the primary surface is in a convex configuration with respect to the first crystal plane; wherein the first crystal plane forming step includes the steps of forming a mask having a predetermined pattern on the substrate, selectively etching a portion of the substrate not covered with the mask, and removing the mask;
   forming a first semiconductor layer directly on both the first crystal plane and the primary surface of the substrate;
   forming a second crystal plane on a primary surface of the first semiconductor layer so that a surface orientation of the second crystal plane is different from a surface orientation of the primary surface of the first semiconductor layer; wherein the primary surface of the first semiconductor layer is in a convex configuration with respect to the second crystal plane; wherein the second crystal plane forming step includes the steps of forming a mask having a predetermined pattern on the first semiconductor layer, selectively etching a portion of the first semiconductor layer not covered with the mask, and removing the mask; and
   forming a second semiconductor layer made of a III group nitride compound material directly on both the second crystal plane and the primary surface of the first semiconductor layer, wherein the first crystal plane is formed so as to be a tilted surface with respect to the primary surface of the substrate and the second crystal plane is formed so as to be a tilted surface with respect to the primary surface of the first semiconductor layer, whereby low-defect regions in the first and second semiconductor layers are provided containing fewer defects as compared to surrounding regions.

7. A method according to claim 6, wherein the substrate is made of $Al_xGa_{1-x}N$ ($0 \leq x \leq 1$), and the second semiconductor layer forming step includes the step of forming an $Al_yGa_{1-y}N$ layer ($0 \leq y \leq 1$) at a crystal growth temperature of about 900° C. or more.

8. A method according to claim 6, wherein the second semiconductor layer forming step includes the steps of: forming over the substrate, a $Al_gGa_{1-a}N$ buffer layer ($0 \leq a \leq 1$) at a crystal growth temperature in a range of about 400° C. to about 900° C.; and forming over the $Al_aGa_{1-a}N$ buffer layer, a second $Al_bGa_{1-b}N$ layer ($0 \leq b \leq 1$) at a crystal growth temperature of about 900° C. or more.

9. A method according to claim 6, wherein the second semiconductor layer forming step includes the step of introducing an impurity to the second semiconductor layer at a concentration of about $10^{21}$ cm$^{-3}$ or less.

10. A method according to claim 6, wherein in the second semiconductor layer forming step, a mole supply ratio of a V group source material to a III group source material (a V/III ratio) is about 200 or more.

11. A method according claim 1, further comprising the step separating the semiconductor layer from the substrate.

12. A method according to claim 11, wherein the crystal plane provided within the primary surface of the substrate extends along a <1,1,−2,0> direction.

13. A method according to claim 1, wherein a crystal growth direction of the substrate is oriented toward a tilted direction in accordance with the tilt of the stepped portion of the substrate.

14. A method according to claim 6, wherein a crystal growth direction of the substrate is oriented toward a tilted direction in accordance with the tilt of the stepped portion of the substrate.

15. A method according to claim 11, wherein a crystal growth direction of the substrate is oriented toward a tilted direction in accordance with the tilt of the stepped portion of the substrate.

16. A method according to claim 1, 6 or 11, wherein the crystal plane forming step includes the step of heating the substrate.

* * * * *